(12) United States Patent
Yoo et al.

(10) Patent No.: US 7,206,057 B2
(45) Date of Patent: Apr. 17, 2007

(54) LIQUID CRYSTAL DISPLAY PANEL AND FABRICATING METHOD THEREOF

(75) Inventors: Soon Sung Yoo, Gunpo-si (KR); Youn Gyoung Chang, Uiwang-si (KR); Heung Lyul Cho, Suwon-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 235 days.

(21) Appl. No.: 10/981,542

(22) Filed: Nov. 5, 2004

(65) Prior Publication Data
US 2005/0099579 A1 May 12, 2005

(30) Foreign Application Priority Data
Nov. 10, 2003 (KR) ................ 10-2003-0079080

(51) Int. Cl.
*G02F 1/1339* (2006.01)
*G02F 1/1337* (2006.01)

(52) U.S. Cl. ................ 349/156; 349/129
(58) Field of Classification Search ........... 349/156, 349/129
See application file for complete search history.

(56) References Cited

U.S. PATENT DOCUMENTS

| | | | | |
|---|---|---|---|---|
| 6,356,335 B1* | 3/2002 | Kim et al. | ........ | 349/156 |
| 6,400,440 B1* | 6/2002 | Colgan et al. | ........ | 349/160 |
| 6,493,050 B1* | 12/2002 | Lien et al. | ........ | 349/106 |
| 6,671,025 B1* | 12/2003 | Ikeda et al. | ........ | 349/156 |
| 6,774,967 B2* | 8/2004 | Kim et al. | ........ | 349/129 |
| 6,825,906 B2* | 11/2004 | Kim et al. | ........ | 349/129 |
| 6,862,062 B2* | 3/2005 | Kubo et al. | ........ | 349/129 |
| 6,894,753 B2* | 5/2005 | Song et al. | ........ | 349/129 |
| 6,922,219 B2* | 7/2005 | Jin et al. | ........ | 349/113 |
| 7,019,806 B2* | 3/2006 | Um et al. | ........ | 349/129 |
| 7,133,108 B2* | 11/2006 | Shimizu et al. | ........ | 349/155 |
| 7,139,061 B2* | 11/2006 | Ikeda et al. | ........ | 349/156 |
| 2002/0039166 A1* | 4/2002 | Song | ........ | 349/156 |
| 2002/0067450 A1* | 6/2002 | Moriya | ........ | 349/129 |
| 2002/0149728 A1* | 10/2002 | Ogishima et al. | ........ | 349/129 |
| 2004/0012743 A1* | 1/2004 | Liu et al. | ........ | 349/129 |

(Continued)

FOREIGN PATENT DOCUMENTS

EP   1 030 211 A2   8/2000

(Continued)

*Primary Examiner*—James A. Dudek
(74) *Attorney, Agent, or Firm*—McKenna Long & Aldridge LLP

(57) ABSTRACT

A liquid crystal display (LCD) panel is fabricated in a simplified process. The LCD panel includes a thin film transistor (TFT) array substrate with a gate and data lines crossing each other to define a pixel area, a TFT at the crossings of the gate and data lines, a protective film, and a pixel electrode connected to the TFT and formed within a pixel opening that is arranged at the pixel area and formed through the protective film and a gate insulating film. A color filter array substrate is joined to the TFT array substrate. A pattern spacer is between the TFT and color filter array substrate and overlaps at least one of the gate line, the data line, and the thin film transistor. A rib is formed from the same layer as the pattern spacer and overlaps the pixel electrode. Liquid crystal material is provided within the LCD panel.

18 Claims, 25 Drawing Sheets

U.S. PATENT DOCUMENTS

2004/0027523 A9* 2/2004 Kim et al. .................. 349/129
2004/0090581 A1* 5/2004 Song et al. ................. 349/129
2005/0185130 A1* 8/2005 Oh et al. ................... 349/156
2006/0203177 A1* 9/2006 Cho et al. .................. 349/155
2006/0203178 A1* 9/2006 Cho et al. .................. 349/156

FOREIGN PATENT DOCUMENTS

KR    10-2002-0013307 A    2/2002

* cited by examiner

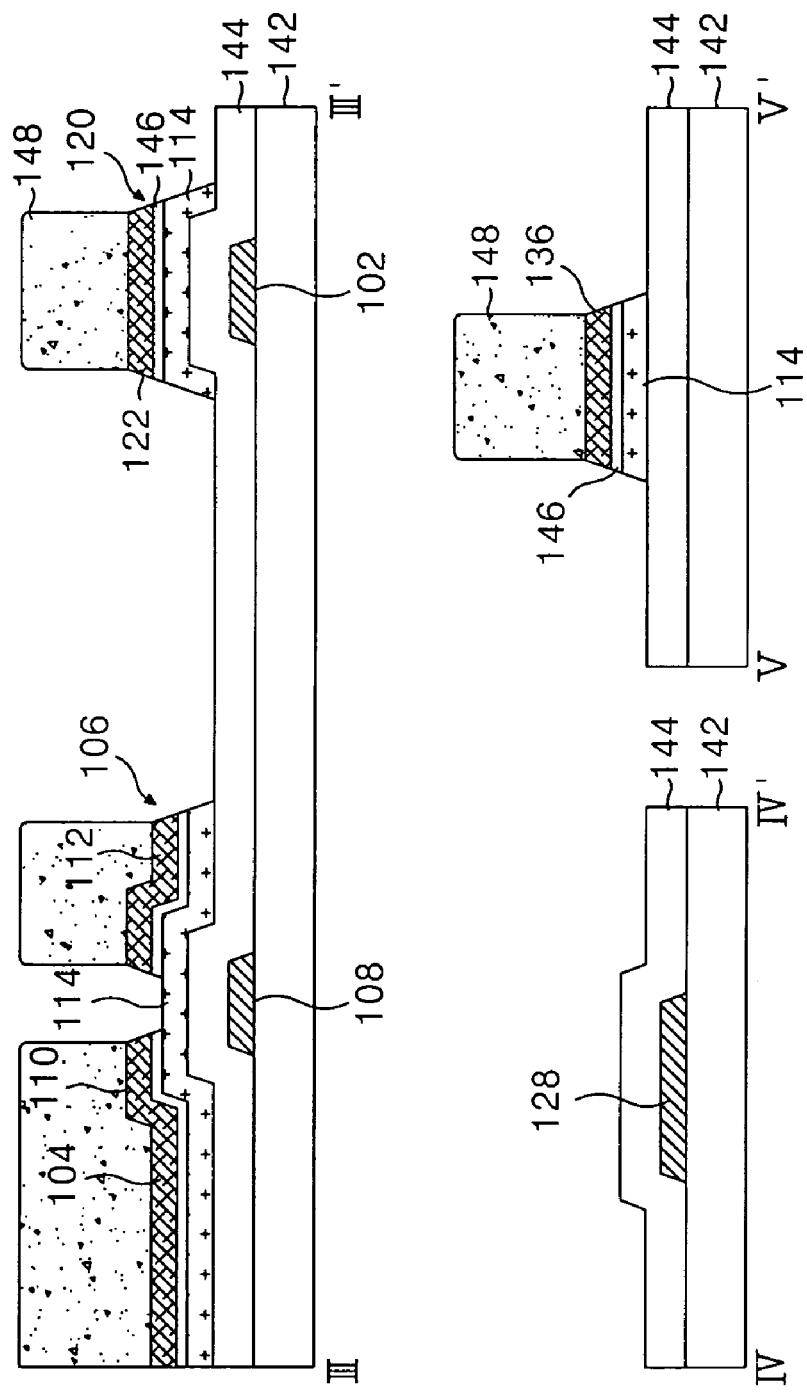

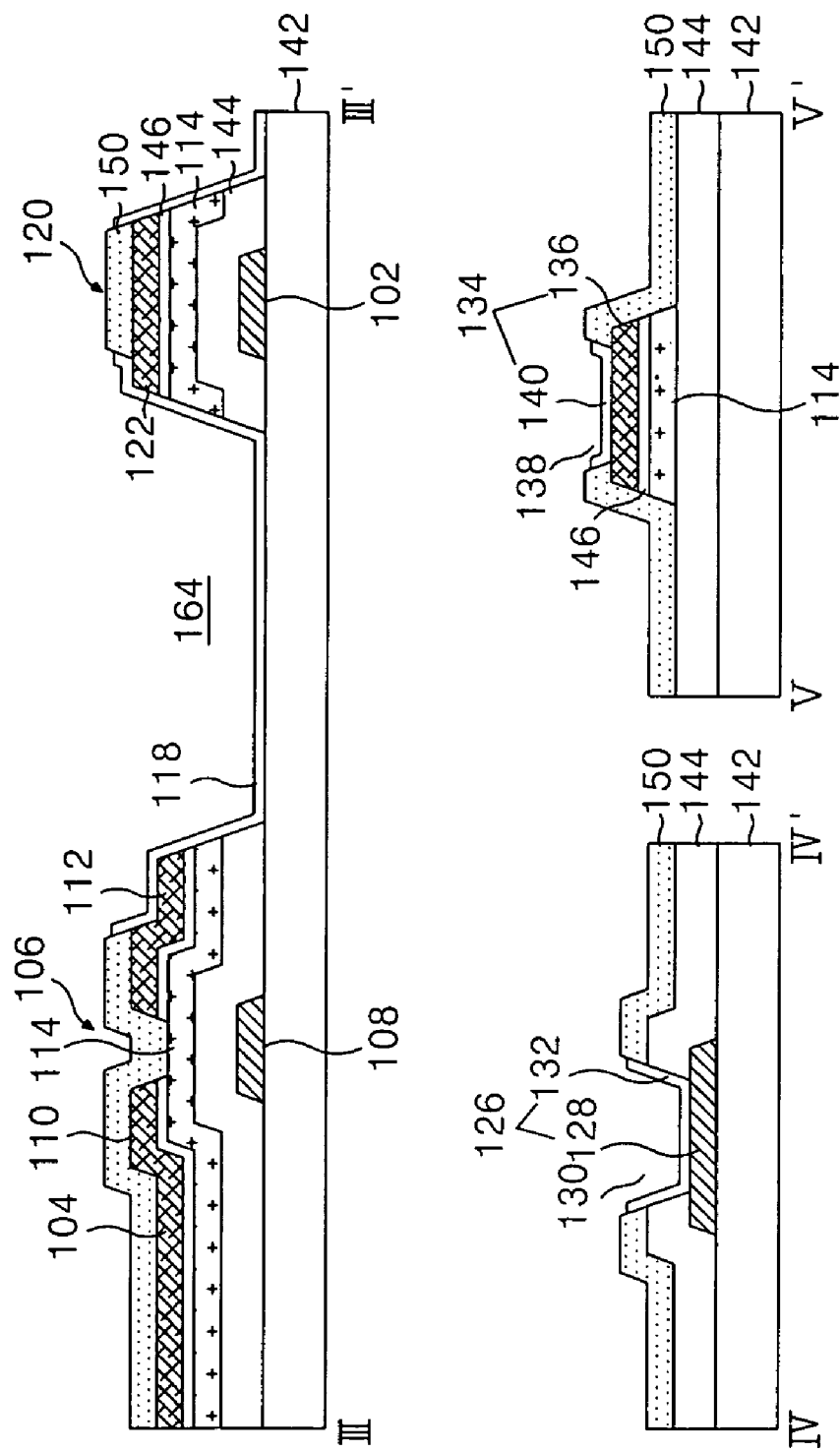

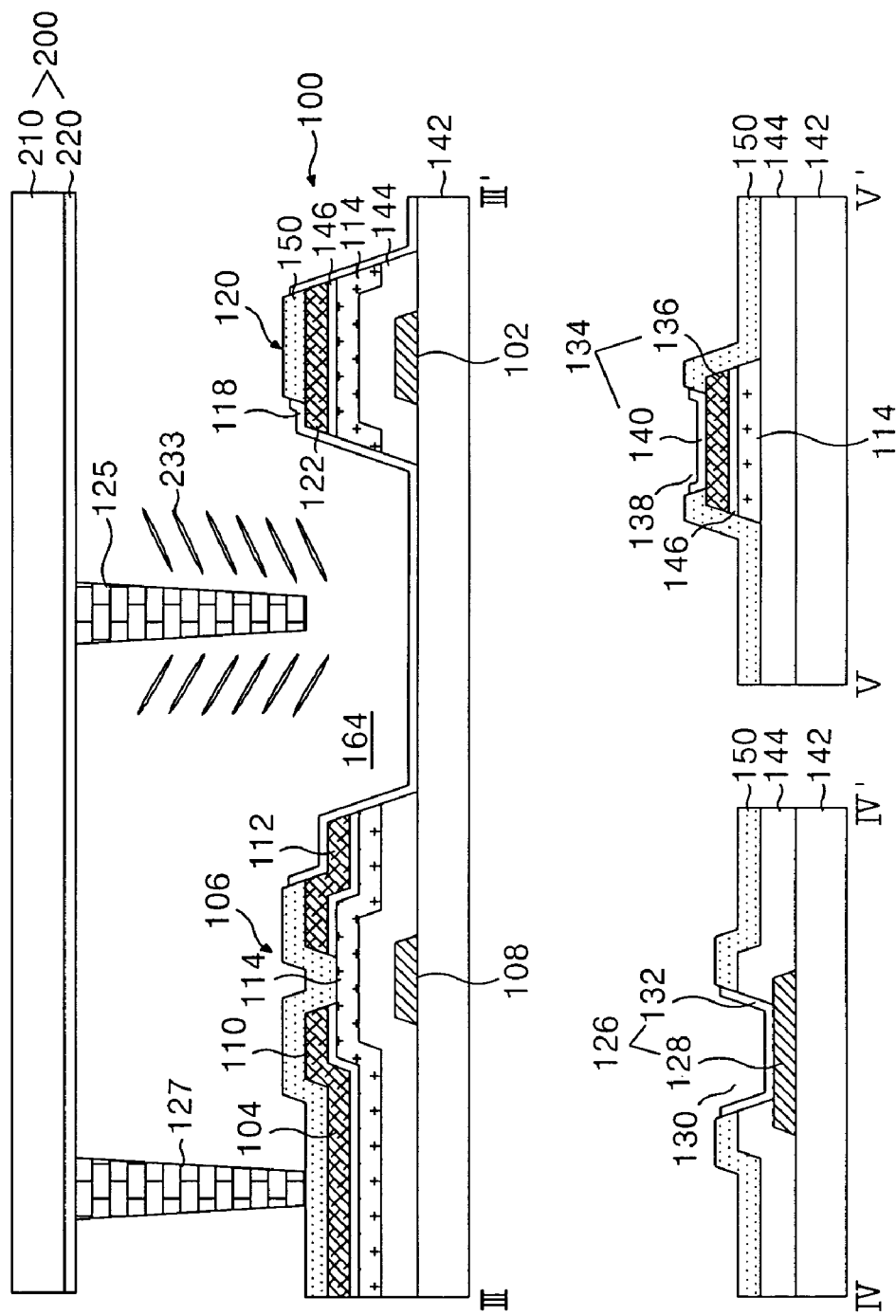

LIQUID CRYSTAL DISPLAY PANEL AND FABRICATING METHOD THEREOF

This application claims the benefit of Korean Patent Application No. P2003-79080, filed on Nov. 10, 2003, which is hereby incorporated by reference for all purposes as if fully set forth herein.

BACKGROUND OF THE INVENTION

1. Field of the Invention

The present invention relates to liquid crystal display (LCD) devices. More particularly, the present invention relates to an LCD panel and a simplified method of fabricating the same.

2. Discussion of the Related Art

Liquid crystal display (LCD) devices express pictures by selectively altering light transmittance characteristics of liquid crystal material within an LCD panel having a plurality of pixels arranged in a matrix. Light transmittance characteristics of the liquid crystal material can be selectively altered with a driving circuit that controls the generation of an electric field through the liquid crystal material (i.e., driving the liquid crystal material).

LCD panels generally include a TFT array substrate joined to, and separated from, a color filter array substrate to form a cell gap. Spacers are distributed within the cell gap to uniformly maintain the distance between the TFT array and color filter array substrates and liquid crystal material is arranged within the cell gap containing the spacers.

The TFT array substrate typically includes gate lines, data lines crossing the gate lines to define pixel areas, switching devices (i.e., TFTs) at the crossings of the gate and data lines, pixel electrodes at each pixel area and connected to each TFT, and an alignment film coated thereon. The gate and data lines receive signals from the driving circuits via corresponding pads. In response to scanning signals transmitted by the gate lines, the TFTs transfer pixel signals from corresponding data lines to corresponding pixel electrodes.

The color filter array substrate typically includes color filters arranged within each pixel area, a black matrix dividing color filters and reflecting external light, a common electrode applying a reference voltage to the pixel areas, and an alignment film coated thereon.

Constructed as described above, the TFT and color filter array substrates are joined together with a sealant and liquid crystal material is injected into the cell gap to complete fabrication of the LCD panel.

The related art process used to fabricate the TFT array substrate described above can be complicated and relatively expensive because it involves a number of semiconductor processing techniques that require a plurality of mask processes. It is generally known that a single mask process requires many sub-processes such as thin film deposition, cleaning, photolithography, etching, photo-resist stripping, inspection, etc. To reduce the complexity and cost associated with fabricating TFT array substrates, procedures have been developed to minimize the number of mask processes required. Accordingly, a four-mask process has been developed that removes the necessity of a mask process from a standard five-mask process.

FIG. 1 illustrates a plan view of a TFT array substrate of an LCD device, fabricated using a related art four-mask process. FIG. 2 illustrates a sectional view of the TFT array substrate taken along the I–I' line shown in FIG. 1.

Referring to FIGS. 1 and 2, the TFT array substrate includes a lower substrate 42 supporting gate lines 2, data lines 4 crossing the gate lines 2 to define a plurality of pixel areas, a gate insulating film 44 between the gate and data lines 2 and 4, a TFT 6 provided each crossing of the gate and data lines 2 and 4, a pixel electrode 18 provided at each pixel area. The TFT array substrate further supports a storage capacitor 20 provided at a region where the pixel electrode 18 overlaps a pre-stage gate line 2, a gate pad 26 connected to the gate line 2, and a data pad 34 connected to the data line 4.

In response to a gate signal applied from a gate line 2, a TFT 6 charges and maintains a pixel signal, applied to a corresponding data line 4, in the pixel electrode 18. Accordingly, each TFT 6 includes a gate electrode 8 connected to a corresponding gate line 2, a source electrode 10 connected to a corresponding data line 4, a drain electrode 12 connected to a corresponding pixel electrode 18, and an active layer 14 overlapping the gate electrode 8. The active layer 14 is overlapped by the data line 4, a lower data pad electrode 36, a storage electrode 22, and defines a channel between the source and drain electrodes 10 and 12 that also overlap the active layer 14. An ohmic contact layer 48 is formed on the active layer 14 and ohmically contacts the data line 4, the source electrode 10, and the drain electrode 12, the lower data pad electrode 36, and storage electrode 22.

Each pixel electrode 18 is connected to the drain electrode 12 of a corresponding TFT 6 via a first contact hole 16 formed through a protective film 50. During operation, an electric field may be generated between the pixel electrode 18 and a common electrode supported by an upper substrate (not shown). The liquid crystal material has a particular dielectric anisotropy. Therefore, in the presence of the electric field, molecules within the liquid crystal material rotate to align themselves between the TFT and color filter array substrates. The magnitude of the applied electric field determines the extent of rotation of the liquid crystal molecules. Accordingly, various gray scale levels of light emitted by a light source (not shown) may be transmitted by a pixel area by varying the magnitude of the applied electric field.

Each storage capacitor 20 consists of a gate line 2 and the portion of the storage electrode 22 overlapping the gate line 2, wherein the two conductors are separated by the gate insulating film 44, the active layer 14, and the ohmic contact layer 48. The pixel electrode 18 is connected to the storage electrode 22 via a second contact hole 24 formed through the protective film 50. Constructed as described above, the storage capacitor 20 allows pixel signals charged at the pixel electrode 18 to be uniformly maintained until a next pixel signal is charged at the pixel electrode 18.

Each gate line 2 is connected to a gate driver (not shown) via a corresponding gate pad 26. Accordingly, the gate pad 26 consists of a lower gate pad electrode 28 and an upper gate pad electrode 32. The lower gate pad electrode 28 is an extension of gate line 2 and is connected to the upper gate pad electrode 32 via a third contact hole 30 formed through the gate insulating film 44 and the protective film 50.

Each data line 4 is connected to a data driver (not shown) via a corresponding data pad 34. Accordingly, the data pad 34 consists of a lower data pad electrode 36 and an upper data pad electrode 40. The lower data pad electrode 36 is an extension of the data line 4 and is connected to the upper data pad electrode 40 via a fourth contact hole 38 formed through the protective film 50.

Having described the TFT array substrate above, a method of fabricating the TFT array substrate according to the related art four-mask process will now be described in greater detail with reference to FIGS. 3A to 3D.

Referring to FIG. 3A, a gate metal pattern, including the gate line 2, the gate electrode 8, and the lower gate pad electrode 28, is formed on the lower substrate 42 in a first mask process.

Specifically, a gate metal layer is formed over the entire surface of the lower substrate 42 in a deposition technique such as sputtering. The gate metal layer consists of a single-layer or double-layer structure of chrome (Cr), molybdenum (Mo) or an aluminum group metal, etc. The gate metal layer is then patterned using photolithography and etching techniques in conjunction with an overlaying first mask pattern to provide the aforementioned gate metal pattern.

Referring next to FIG. 3B, a gate insulating film 44 is coated over the entire surface of the lower substrate 42 and on the gate metal pattern. In a second mask process, a semiconductor pattern and a data metal pattern are provided on the gate insulating film 44. The semiconductor pattern consists of the active layer 14 and the ohmic contact layer 48. The data metal pattern consists of the data line 4, the source electrode 10, the drain electrode 12, the lower data pad electrode 36, and the storage electrode 22.

Specifically, the gate insulating film 44, a first and a second semiconductor layer, and a data metal layer are sequentially formed over the surface of the lower substrate 42 and on the gate metal pattern by deposition techniques such as plasma enhanced chemical vapor deposition (PECVD) and sputtering. The gate insulating film 44 typically includes an inorganic insulating material such as silicon nitride (SiNx) or silicon oxide (SiOx). The active layer 14 is formed from the first semiconductor layer and typically includes undoped amorphous silicon. The ohmic contact layer 48 is formed from the second semiconductor layer and typically includes n+ doped amorphous silicon. The data metal layer typically includes molybdenum (Mo), titanium (Ti), tantalum (Ta).

A photo-resist film is then formed over the data metal layer and is photolithographically patterned using a second mask pattern. Specifically, the second mask pattern is provided as a diffractive exposure mask having a diffractive exposure region corresponding to a channel region of a subsequently formed TFT. Upon exposure through the second mask pattern and development, a photo-resist pattern is created wherein a portion of the photo-resist film remaining in a region corresponding to the channel region has a lower height relative to portions of the photo-resist film remaining in regions outside the channel region.

Subsequently, the photo-resist pattern is used as a mask to pattern the data metal layer in a wet etching process and to form the aforementioned data metal pattern (i.e., the data line 4, the source electrode 10, the drain electrode 12, and the storage electrode 22), wherein the source and drain electrodes 10 and 12 are connected to each other in a region corresponding to the channel region. Next, the photo-resist pattern is used as a mask to sequentially pattern the first and second semiconductor layers in a dry etching process and form the active layer 14 and the ohmic contact layer 48.

After the active and ohmic contact layers 14 and 48 are formed, the portion of the photo-resist having the relatively lower height is removed from the region corresponding to the channel region in an ashing process. Upon performing the ashing process, the relatively thicker portions of the photo-resist in regions outside the channel region are thinned but, nevertheless, remain. Using the photo-resist pattern as a mask, the portion of the data metal layer and the ohmic contact layer 48 arranged in the channel region are then etched in a dry etching process. As a result, the active layer 14 within the channel region is exposed, the source electrode 10 is disconnected from the drain electrode 12, and the remaining photo-resist pattern is removed in a stripping process.

Referring next to FIG. 3C, the protective film 50 is coated over the entire surface of the lower substrate 42, on the gate insulting film 44, on the data metal pattern, and on the active layer 14. In a third mask process, the first to fourth contact holes 16, 24, 30, and 38, respectively, are formed through the protective film 50 and gate insulating film 44.

Specifically, the protective film 50 is formed over the surface of the lower substrate 42, and on the gate insulting film 44, the data metal pattern, and the active layer 14 by a deposition technique such as plasma enhanced chemical vapor deposition (PECVD). The protective film 50 typically includes an inorganic insulating material such as silicon nitride (SiNx) or silicon oxide (SiOx), or an organic material having a small dielectric constant such as an acrylic organic compound, BCB (benzocyclobutene) or PFCB (perfluorocyclobutane). A third mask pattern is then arranged over the protective film 50 and the protective film 50 is then patterned by using photolithography and etching processes to thereby define the first to fourth contact holes 16, 24, 30, and 38.

The first contact hole 16 is formed through the protective film 50 to expose the drain electrode 12, the second contact hole 24 is formed through the protective film 50 to expose the storage electrode 22, the third contact hole 30 is formed through the protective film 50 and the gate insulating film 44 to expose the lower gate pad electrode 28, and the fourth contact hole 38 is formed through the protective film 50 to expose the lower data pad electrode 36.

Referring next to FIG. 3D, a transparent conductive pattern including the pixel electrode 18, the upper gate pad electrode 32, and the upper data pad electrode 40 are formed on the protective film 50 in a fourth mask process.

Specifically, a transparent conductive material is coated over the entire surface of the protective film 50 and in the first to fourth contact holes 16, 24, 30, and 38 by a deposition technique such as sputtering. The transparent conductive material typically includes indium-tin-oxide (ITO), tin-oxide (TO), indium-zinc-oxide (IZO) or indium-tin-zinc-oxide (ITZO). In a fourth mask process, the transparent conductive material is patterned using photolithographic and etching techniques to thereby form the aforementioned transparent conductive pattern (i.e., the pixel electrode 18, the upper gate pad electrode 32, and the upper data pad electrode 40).

Accordingly, the pixel electrode 18 is electrically connected to the drain electrode 12 via the first contact hole 16 while also being electrically connected to the storage electrode 22, via the second contact hole 24. The upper gate pad electrode 32 is electrically connected to the lower gate pad electrode 28 via the third contact hole 30 and the upper data pad electrode 40 is electrically connected to the lower data pad electrode 36 via the fourth contact hole 40.

While the TFT array substrate described above may be formed using a four-mask process that is advantageous over previously known five-mask processes, the four-mask process can still be undesirably complicated and, therefore, costly.

Further, and as mentioned above, LCD panels include spacers for uniformly maintaining a distance between the TFT array and color filter array substrates. Spacers have conventionally been implemented as ball spacers. However, in light of the growing trend in fabricating LCD panels according to liquid crystal dispensing techniques, pattern spacers are increasingly being used to replace ball spacers. Pattern spacers are formed on the TFT or color filter array substrates and overlap areas shielded by the black matrix (i.e., the TFT, the data line, and the gate line) and are conventionally fabricated using mask processes that are not used in forming the TFT array substrate. Thus, when forming the pattern spacers on the TFT array substrate, separate mask processes, unique to the pattern spacers, must be used which undesirably increases the complexity and the cost associated with fabricating an LCD panel.

Lastly, vertical alignment (VA) mode LCD panels include ribs that divide pixel areas into multiple domains. Each rib usually overlaps a pixel electrode to induce different alignment directions of liquid crystal molecules within each domain. Because each pixel area of a VA mode LCD panel has multiple domains of alignment directions, they can display images over a relatively wide viewing angle. Similar to pattern spacers, ribs are conventionally fabricated using mask processes that are not used in forming the TFT array substrate. Thus, when forming the ribs on the TFT array substrate, separate mask processes, unique to ribs, must be used which undesirably increases the complexity and the cost associated with fabricating an LCD panel.

To function properly, the ends of the ribs must be precisely spaced apart from the TFT array substrate when the ribs are formed on the color filter array substrate (or they must be precisely spaced from the color filter array substrate when the ribs are formed on the TFT array substrate). However, the pattern spacers must contact both the TFT and color filter array substrates of the LCD panel. As a result, VA mode LCD panels typically incorporate ribs and pattern spacers having different thicknesses and must, therefore, be undesirably formed in different mask processes, regardless of what substrate the ribs and pattern spacers are formed on. As similarly indicated above, separate implementation of mask processes unique the pattern spacers and ribs undesirably increases the complexity and the cost associated with fabricating a VA mode LCD panel.

SUMMARY OF THE INVENTION

Accordingly, the present invention is directed to a liquid crystal display (LCD) panel and a method of fabricating the same that substantially obviates one or more of the problems due to limitations and disadvantages of the related art.

An advantage of the present invention provides an LCD panel and a simplified method of fabricating the same.

Another advantage of the present invention provides an LCD panel and a method of fabricating the same that incorporates a simplified process of forming a pattern spacer and a rib.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display panel may, for example, include a thin film transistor array substrate; a color filter array substrate joined to the thin film transistor array substrate; a pattern spacer between the thin film transistor and color filter array substrates; and a rib between the thin film transistor and color filter array substrates. The thin film transistor array substrate may, for example, include a gate line on a first substrate; a data line crossing the gate line and defining a pixel area; a gate insulating film between the gate and data lines; a thin film transistor at the crossing of the gate and data lines; a protective film over the substrate; a pixel opening defined within the protective film and the gate insulating film, wherein the pixel opening is aligned within the pixel area; and a pixel electrode within the pixel opening, wherein the pixel electrode is connected to the thin film transistor. The pattern spacer may overlap at least one of the gate line, the data line, and the thin film transistor while the rib may overlap the pixel electrode and be formed of the same layer as the pattern spacer. Further, liquid crystal material may be between the thin film transistor and color filter array substrates.

In one aspect of the present invention, the pattern spacer may be on the protective film; and the rib may be on the pixel electrode. Accordingly, the pattern spacer may contact the color filter array substrate and the rib may be spaced apart from the color filter array substrate by a predetermined distance.

In another aspect of the present invention, the pattern spacer and the rib are on the color filter array substrate. Accordingly, the pattern spacer may contact the thin film transistor array substrate and the rib may be spaced apart from the thin film transistor array substrate by a predetermined distance.

In still another aspect of the present invention, the thin film transistor array substrate includes a gate pad having a lower gate pad electrode connected to the gate line; a first contact hole through the protective film and the gate insulating film and exposing the lower gate pad electrode; and an upper gate pad electrode within the first contact hole and contacting the lower gate pad electrode.

In another aspect of the present invention, the thin film transistor array substrate may include a data pad having a lower data pad electrode connected to the data line; a second contact hole through the protective film and exposing the lower data pad electrode; and an upper data pad electrode within the second contact hole and contacting the lower data pad electrode.

In one aspect of the present invention, the liquid crystal display panel may further include a storage capacitor comprised of the gate line and an upper storage electrode overlapping the gate line, wherein the gate insulating film is between the gate line and the upper storage electrode, and wherein the upper storage electrode is connected to the pixel electrode.

According to principles of the present invention, a method of fabricating a liquid crystal display panel may, for example, include forming, on a substrate, a gate line connected to a gate electrode; forming a gate insulating film over the substrate and on the gate line and the gate electrode; forming a semiconductor pattern on the gate insulating film; on the semiconductor pattern, forming a data line crossing the gate line, a source electrode connected to the data line, and a drain electrode opposing the source electrode, wherein a pixel area may be defined by the crossing of the gate and data lines, and wherein a thin film transistor may include the gate electrode, the semiconductor pattern, the source electrode, and the drain electrode; forming a protective film over the entire surface of the substrate; providing a pixel opening through the protective film and the gate insulating film within the pixel area; forming a pixel electrode within the pixel opening, wherein the pixel electrode may be connected to the drain electrode; forming a pattern spacer overlapping at least one of the gate line, the data line, and the thin film transistor; and forming a rib overlapping the pixel electrode, wherein the pattern spacer and the rib may have the same thickness.

According to principles of the present invention, another method of fabricating a liquid crystal display panel may, for example, include forming a gate metal layer on a substrate; patterning the gate metal layer using a first mask to form a gate line and a gate electrode; forming a gate insulating film, an undoped amorphous silicon layer, a doped amorphous silicon layer, and a data metal layer on the patterned gate metal layer; patterning the data metal layer, the doped amorphous silicon layer, and the undoped amorphous silicon layer using a second mask to form a data line, a source electrode, a drain electrode, and a semiconductor pattern, wherein a thin film transistor may include the gate electrode, the semiconductor pattern, the source electrode, and the drain electrode; forming a protective film over the entire surface of the substrate; forming a pixel opening passing through the protective film and the gate insulating film and forming a pixel electrode within the pixel opening using a third mask, wherein the pixel electrode may be connected to the drain electrode; forming an insulating layer over the entire surface of the substrate; and patterning the insulating layer using a fourth mask to form a pattern spacer and a rib, wherein the pattern spacer overlaps at least one of the gate line, the data line, and the thin film transistor, and wherein the rib overlaps the pixel electrode.

According to principles of the present invention, still another method of fabricating a liquid crystal display panel may, for example, include forming a thin film transistor array substrate; providing a color filter array substrate; forming a pattern spacer on the color filter array substrate; and forming a rib on the color filter array substrate, wherein the rib is formed from the same layer as the pattern spacer. The thin film transistor array substrate may be formed by forming a gate line on a first substrate; forming a data line crossing the gate line to define a pixel area; forming a gate insulating film between the gate and data lines; forming a thin film transistor at the crossing of the gate and data lines; forming a protective film over the thin film transistor; forming a pixel opening within the protective film and the gate insulating film; forming a pixel electrode within the pixel opening, wherein the pixel electrode contacts the thin film transistor; and forming an alignment film over the pixel electrode. The pattern spacer may, for example, overlap at least one of the gate line, the data line, and the thin film transistor and the rib may, for example, overlap the pixel electrode.

In one aspect of the present invention, the pixel opening and pixel electrode may be formed by providing a photo-resist pattern on the protective film; etching the protective film and the gate insulating film exposed through the photo-resist pattern to form the pixel opening; forming a transparent conductive layer over the photo-resist pattern and within the pixel opening; and removing the photo-resist pattern and the transparent conductive layer thereon to form the pixel electrode.

In another aspect of the present invention, any of the aforementioned methods may include steps of forming a lower gate pad electrode connected to the gate line; forming a first contact hole through the protective film and the gate insulating film to expose the lower gate pad electrode; and forming an upper gate pad electrode within the first contact hole, wherein the upper gate pad electrode may be formed from the same layer as the pixel electrode.

In still another aspect of the present invention, any of the aforementioned methods may include steps of forming a lower data pad electrode connected to the data line; forming a second contact hole through the protective film to expose the lower data pad electrode; and forming an upper data pad electrode within the second contact hole, wherein the upper data pad electrode may be formed from the same layer as the pixel electrode.

In yet another aspect of the present invention, any of the aforementioned methods may include steps of forming an upper storage electrode overlapping with the gate line, wherein the gate insulating film is between the gate line and the upper storage electrode, and wherein the upper storage electrode is connected to the pixel electrode.

In still another aspect of the present invention, the pattern spacer may contact the color filter array substrate and the rib may be spaced apart from the color filter array substrate by a predetermined distance.

In another aspect of the present invention, the pattern spacer may contact the thin film array transistor substrate and the rib may be spaced apart from the thin film array transistor substrate by a predetermined distance.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 8A to 8D illustrate sectional views specifically describing the second mask process in the method of fabricating the TFT array substrate in the LCD panel shown in FIGS. 4 and 5;

FIGS. 10A to 10D illustrate sectional views specifically describing the third mask process in the method of fabricating the TFT array substrate in the LCD panel shown in FIGS. 4 and 5;

FIG. 12 illustrates a plan view of a portion of an LCD panel according to a second embodiment of the present invention.

DETAILED DESCRIPTION OF THE ILLUSTRATED EMBODIMENTS

Reference will now be made in detail to embodiments of the present invention, examples of which are illustrated in the accompanying drawings.

Figure 1:
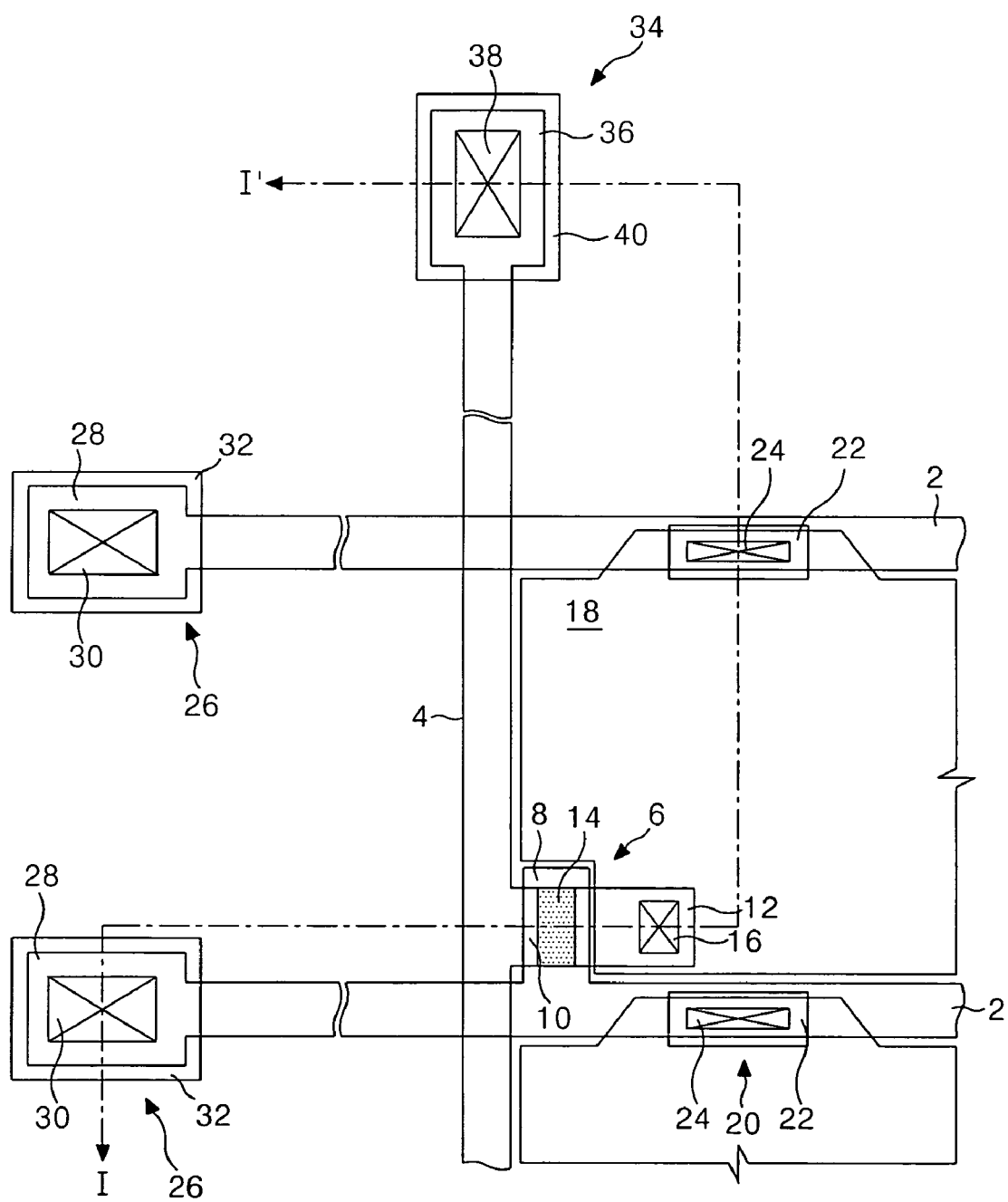
FIG. 1 illustrates a plan view of a thin film transistor (TFT) array substrate, fabricated using a related art four-mask process.
Figure 2:
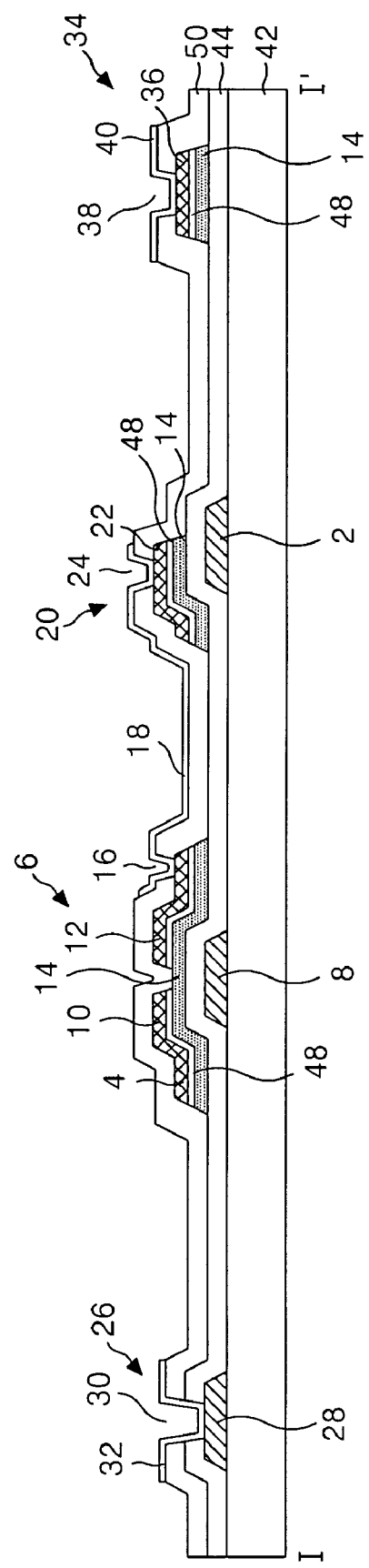
FIG. 2 illustrates a sectional view of the TFT array substrate taken along line I–I' shown in FIG. 1.
Figure 3A:
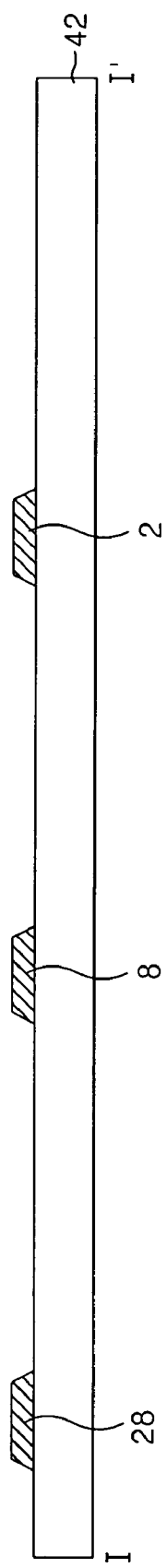
FIGS. 3A to 3D illustrate a method of fabricating the TFT array substrate shown in FIG. 2.
Figure 3B:
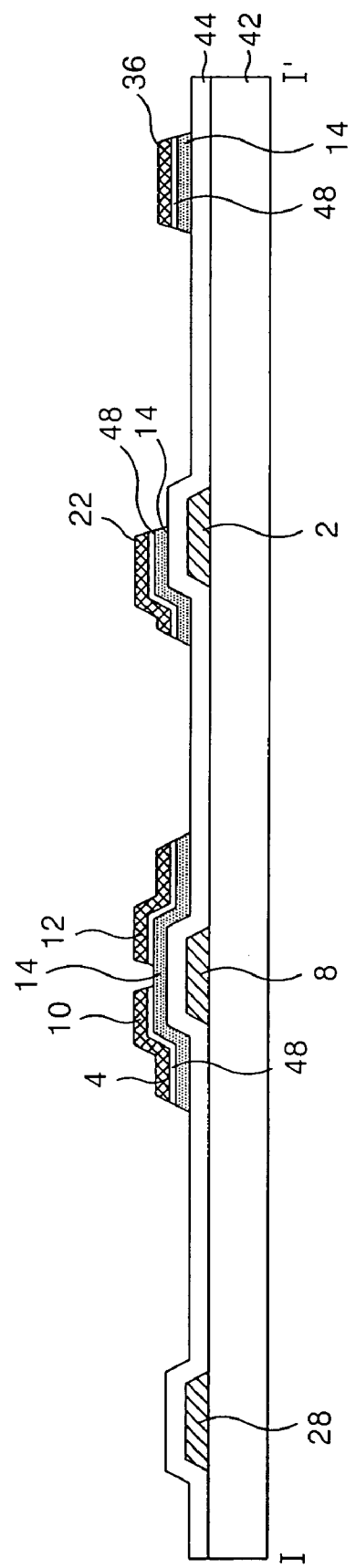
Figure 3C:
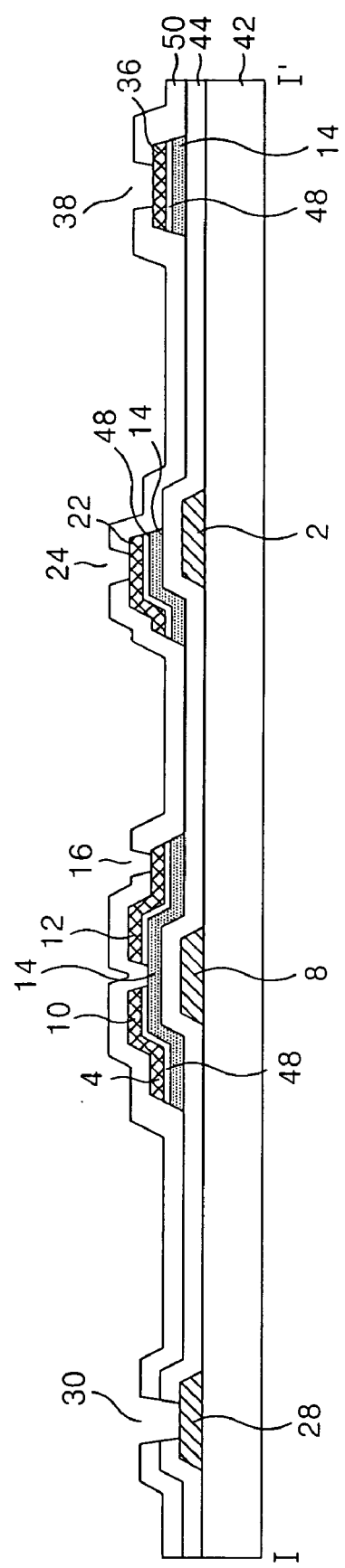
Figure 3D:
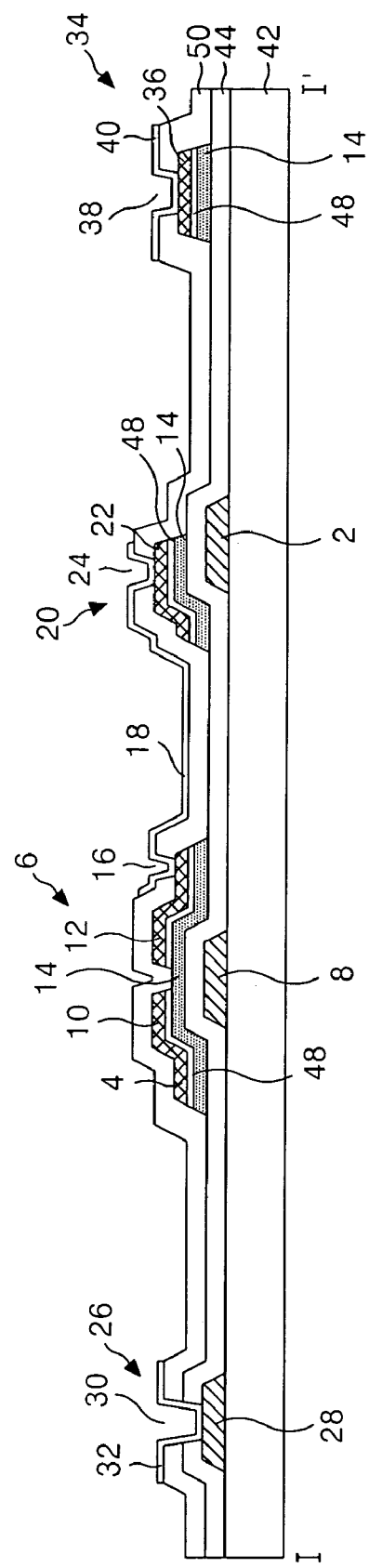
Figure 4:
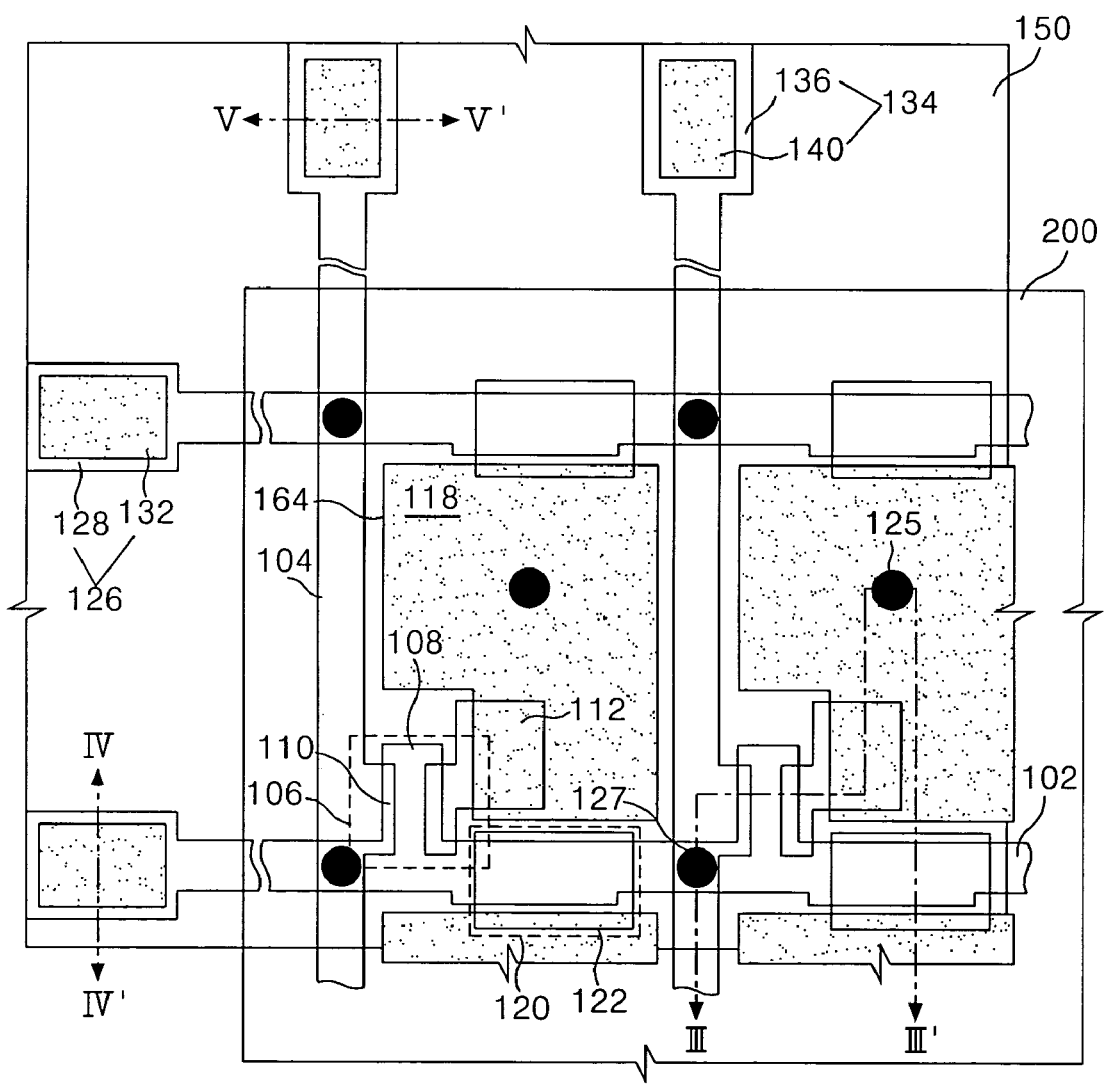
FIG. 4 illustrates a plan view of a portion of a liquid crystal display (LCD) panel according to a first embodiment of the present invention.
Figure 5:
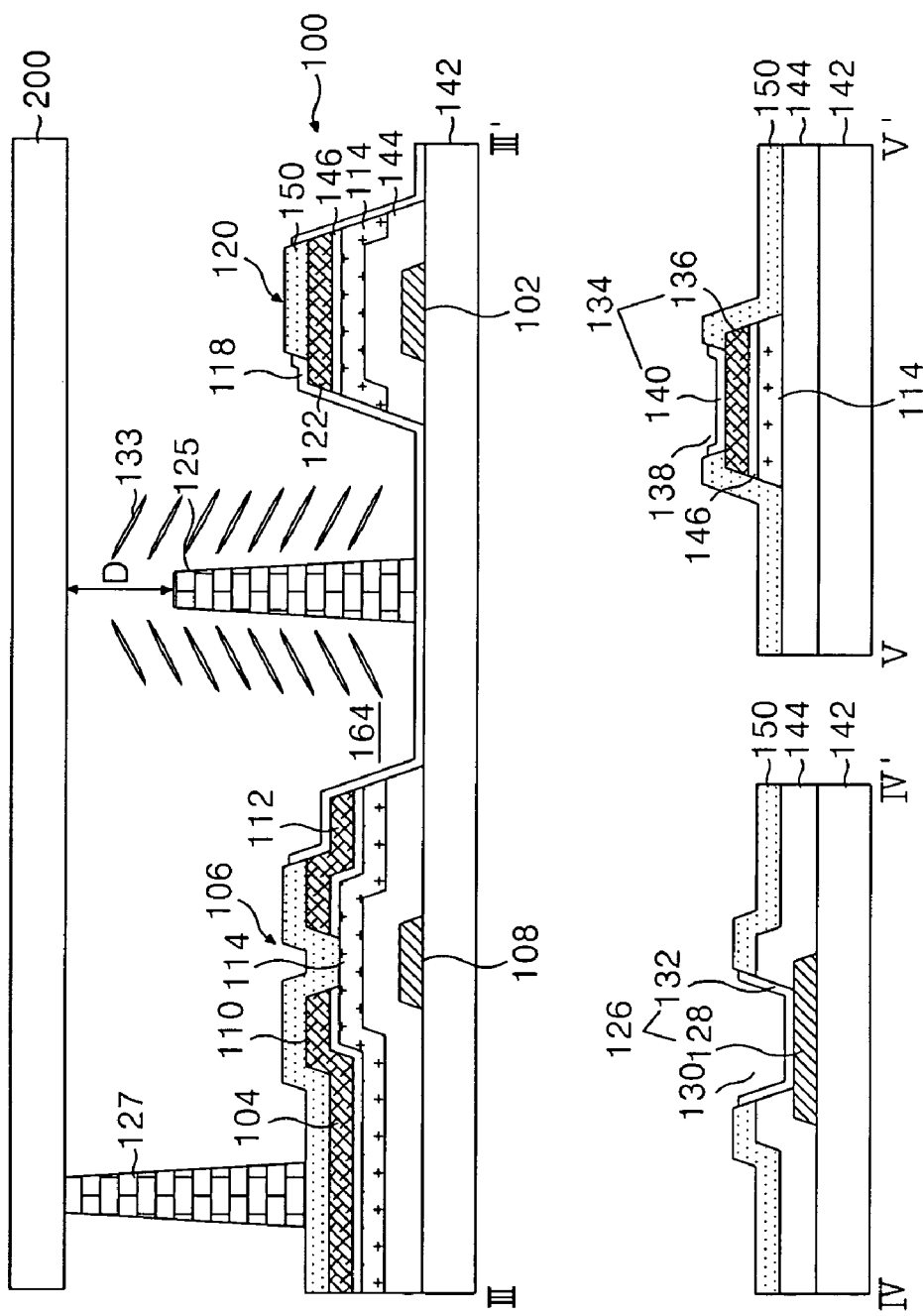
FIG. 5 illustrates a sectional view of the LCD panel taken along lines III–III', IV–IV' and V–V' shown in FIG. 4.

FIG. 4 illustrates a plan view of a portion of a liquid crystal display (LCD) panel according to a first embodiment of the present invention. FIG. 5 illustrates a sectional view of the LCD panel taken along lines III–III', IV–IV' and V–V' shown in FIG. 4.

Referring to FIGS. 4 and 5, the LCD panel includes a thin film transistor (TFT) array substrate 100 joined to, and spaced apart from, a color filter array substrate 200 to define a cell gap. The height of the cell gap is defined by a pattern spacer 127 between the TFT and color filter array substrates 100 and 200. Liquid crystal material may be provided between the TFT and color filter array substrates 100 and 200, the alignment characteristics of which may be differentiated by ribs 125 formed on a pixel electrode 118. As shown in FIG. 5, the rib 125 may be spaced apart from the color filter array substrate 200 by a predetermined distance, D. Accordingly, the presence of the ribs 125 may create multiple domains of liquid crystal orientation within a single pixel area, thereby enlarging the viewing angle of the LCD panel.

According to principles of the present invention, the TFT array substrate 100 may, for example, include gate lines 102 and data lines 104 formed so as to cross each other on a lower substrate 142 to define a plurality of pixel areas; a gate insulating film 144 formed between the gate and data lines 102 and 104; a thin film transistor 106 at each crossing of the gate and data lines 102 and 104; and the pixel electrode 118 arranged within each pixel area. The TFT array substrate 100 may further include a storage capacitor 120 provided at a region where an upper storage electrode 122 and gate line 102 overlap, a gate pad 126 connected to each gate line 102, and a data pad 134 connected to each data line 104. The upper storage electrode 122 may be connected to the pixel electrode 118.

In response to a gate signal supplied to the a gate line 102, a TFT 106 charges and maintains a pixel signal, supplied to a corresponding data line 104, in the pixel electrode 118. Accordingly, each TFT 106 may, for example, include a gate electrode 108 connected to a corresponding gate line 102, a source electrode 110 connected to a corresponding data line 104, and a drain electrode 112 connected to a corresponding pixel electrode 118. Further, each thin film transistor 106 may include an active layer 114 overlapping the gate electrode 108 and insulated therefrom by the gate insulating film 144. Accordingly, a channel may be formed in a portion of the active layer 114 between the source electrode 110 and the drain electrode 112. An ohmic contact layer 146 may be formed on the active layer 114 to ohmically contact the data line 104, the source electrode 110, and the drain electrode 112. Further, the active and ohmic contact layers 114 and 146 are overlapped by the data line 104, a lower data pad electrode 136, and an upper storage electrode 122.

According to principles of the present invention, the pixel electrode 118 may be provided within a pixel opening 164 formed through a protective film 150 and the gate insulating film 144 to expose portions of the lower substrate 142 within the pixel area. The pixel electrode 118 may be connected to portions of the drain electrode 112 exposed within the pixel opening 164 and may charge pixel signals transferred by the TFT 106 to generate an electric field with a common electrode provided supported by a color filter array substrate (not shown). Liquid crystal material 133 has a particular dielectric anisotropy. Therefore, in the presence of the electric field, molecules within the liquid crystal material 133 rotate to align themselves between the TFT and color filter array substrates. The magnitude of the applied electric field determines the extent of rotation of the liquid crystal molecules. Accordingly, various gray scale levels of light emitted by a light source (not shown) may be transmitted by a pixel area by varying the magnitude of the applied electric field.

The storage capacitor 120 may, for example, include a lower storage electrode (i.e., a portion of a gate line 102) and a portion of the upper storage electrode 122 overlapping the lower storage electrode. The upper and lower storage electrodes may be separated from each other by the gate insulating film 144, the active layer 114, and the ohmic contact layer 146. The pixel electrode 118 is connected to portions of the upper storage electrode 122 exposed within the pixel opening 164. Accordingly, the storage capacitor 120 allows charges to be stably maintained in the pixel electrode 118 until the next pixel signal is charged.

The gate line 102 may be connected to a gate driver (not shown) via the gate pad 126. In one aspect of the present invention, the gate pad 126 may comprise a lower gate pad electrode 128 connected to an upper gate pad electrode 132. In another aspect of the present invention, the lower gate pad electrode 128 may extend from the gate line 102. In still another aspect of the present invention, the upper gate pad electrode 132 may be connected to the lower gate pad electrode 128 via a first contact hole 130 formed through the protective film 150 and the gate insulating film 144.

The data line 104 may be connected to a data driver (not shown) via a data pad 134. In one aspect of the present invention, the data pad 134 may comprise a lower data pad electrode 136 connected to an upper data pad electrode 140. In another aspect of the present invention, the lower data pad electrode 136 may extend from the data line 104. In still another aspect of the present invention, the upper data pad electrode 140 may be connected to the lower data pad electrode 136 via a second contact hole 138 formed through the protective film 150.

The pattern spacer 127 may be provided on the protective film pattern 150 and arranged within a wiring area of the TFT array substrate. Accordingly, the pattern spacer 127 may overlap the TFT 106, the data line 104, and/or the gate line 102.

The rib 125 may be provided on the pixel electrode 118. In one aspect of the present invention, the pixel electrode 118 may be formed directly on the lower substrate 142. In another aspect of the present invention, the rib 125 may be formed in the same process that forms the pattern spacer 127. Accordingly, the rib 125 may be spaced apart from the color filter array substrate 200 by the predetermined distance D because the distance between the pattern spacer 127, within the wiring area, and the lower substrate 142 is greater than the distance between the rib 125, on the pixel electrode directly contacting the lower substrate 142, and the lower substrate 142. For example, the pattern spacer 127 is separated from the lower substrate by the protective film pattern 150, the data line 104 (or the gate line 102 or TFT 106), the ohmic contact layer 146, and active layer 114, and the gate insulating film 144 whereas the rib 125 is separated from the lower substrate 142 only by the pixel electrode 118.

Although not specifically shown, an alignment film may be provided over the TFT array substrate having the pattern spacer 127 and the rib 125 to impart a predetermined alignment of a subsequently provided liquid crystal material 133.

The color filter array substrate may, for example, include a plurality of color filters aligned with each pixel area, a black matrix for visually a dividing the color filters and for reflecting external light, an overcoat layer for planarizing a topography of the color filters, a common electrode for commonly supplying a reference voltage to the liquid crystal material 133 within each pixel area, and an alignment film coated over the common electrode.

In one aspect of the present invention, the liquid crystal material 133 may be dispensed directly onto the TFT array substrate 100 before joining the TFT array substrate 100 to the color filter array substrate 200. In an alternate aspect of the present invention, the liquid crystal material 133 may be injected into the cell gap after the TFT array substrate has been joined to the color filter array substrate. After such injection, the cell gap may be sealed.

According to principles of the present invention, the pixel electrode 118, the upper gate pad electrode 132, and the upper data pad electrode 140 may, collectively, comprise a transparent conductive pattern. In one aspect of the present invention, the transparent conductive pattern may be formed in a lift-off process, whereupon a photo-resist pattern used to pattern the protective and gate insulating films 150 and 144 is removed. Further, the pattern spacer 127 and the rib 125 may be simultaneously formed in the same mask process.

Having described the LCD panel and TFT array substrate above with respect to FIGS. 4 and 5, a method of fabricating the aforementioned TFT array substrate will now be discussed in greater detail.

Figure 6A:
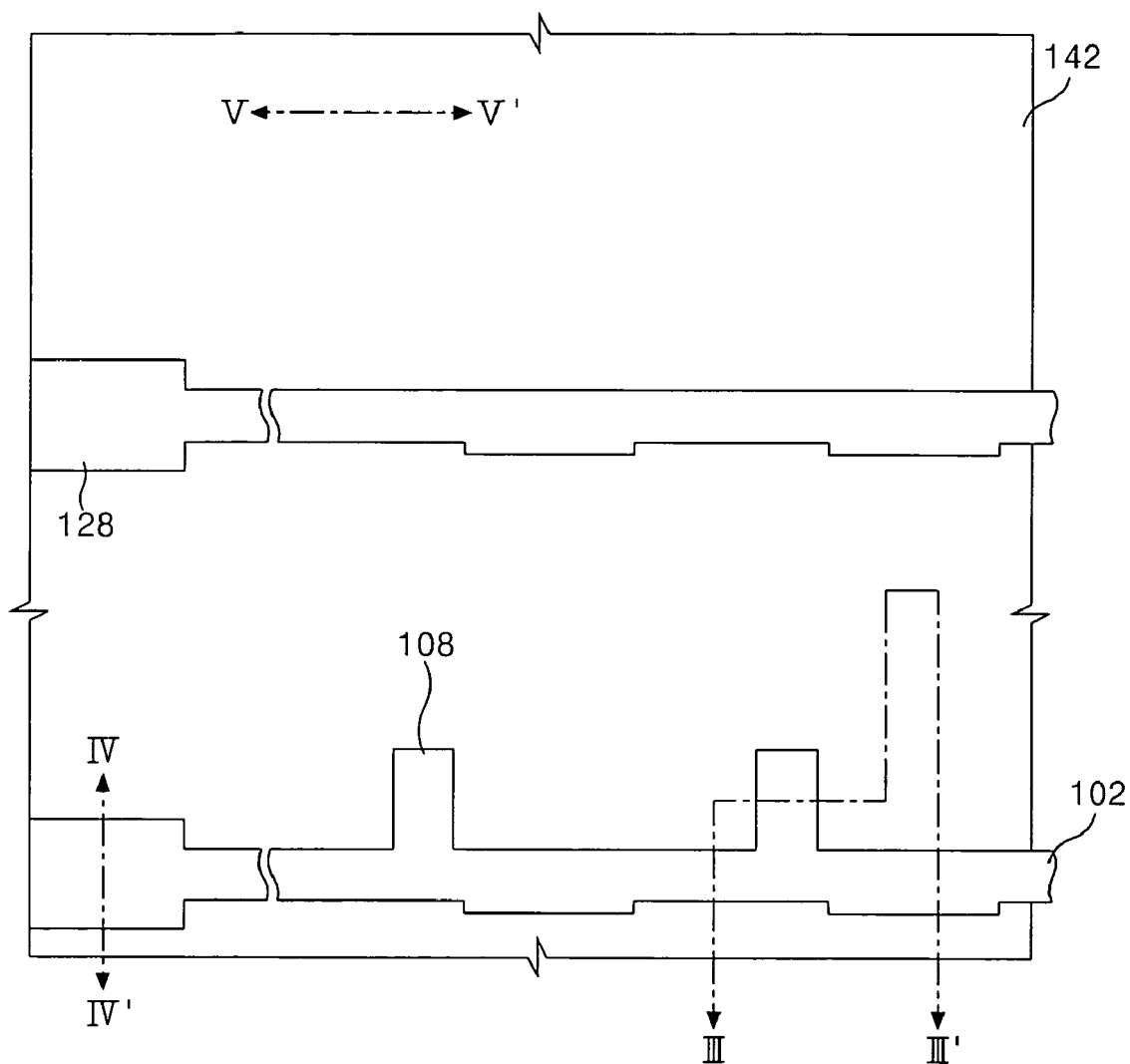
FIGS. 6A and 6B illustrate plan and section views, respectively, describing a first mask process in a method of fabricating a TFT array substrate in the LCD panel shown in FIGS. 4 and 5.
Figure 6B:
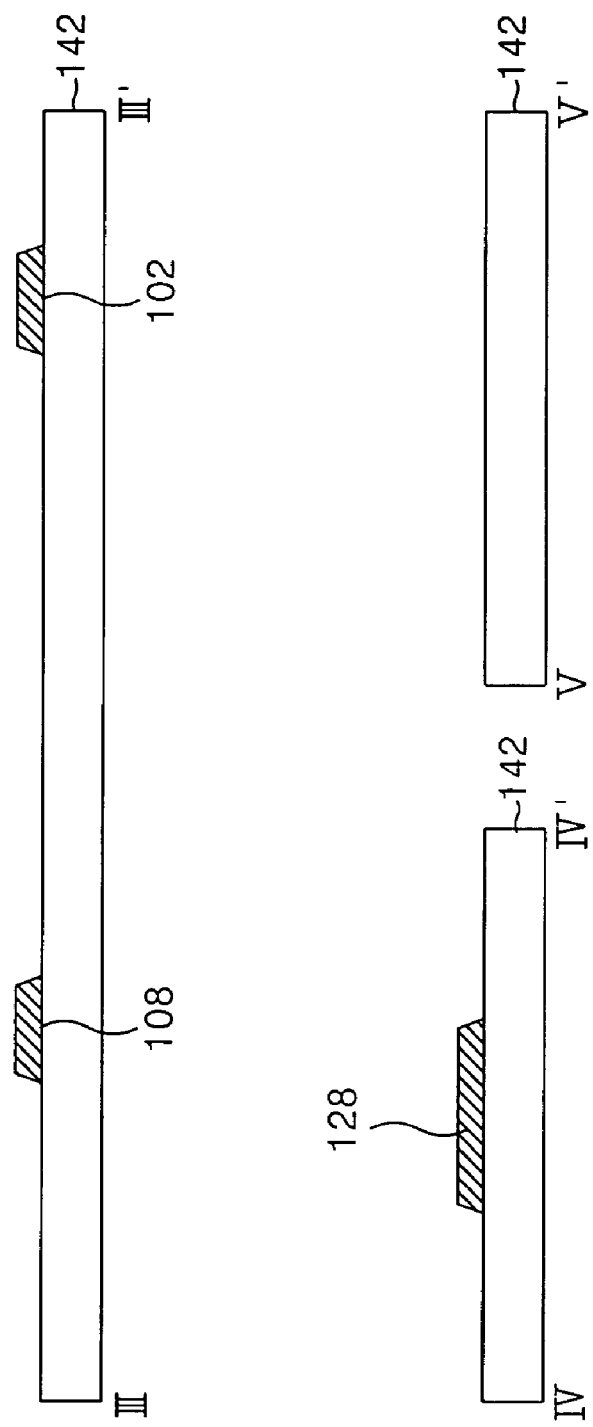

FIGS. 6A and 6B illustrate plan and section views, respectively, describing a first mask process in a method of fabricating a TFT array substrate in the LCD panel shown in FIGS. 4 and 5.

Referring to FIGS. 6A and 6B, a gate metal pattern may be formed on the lower substrate 142 in a first mask process. In one aspect of the present invention, the gate metal pattern may include, for example, the gate line 102, the gate electrode 108 connected to the gate line 102, and the lower gate pad electrode 128.

According to principles of the present invention, the gate metal pattern may be formed by depositing a gate metal layer over the lower substrate 142 in a deposition technique such as sputtering. Then, the gate metal layer may be patterned using photolithographic and etching techniques using a first mask to provide the aforementioned gate metal pattern. In one aspect of the present invention, the gate metal may include a material such as Cr, MoW, Cr/Al, Cu, Al(Nd), Mo/Al, Mo/Al(Nd) or Cr/Al(Nd), or the like, or combinations thereof.

Figure 7A:
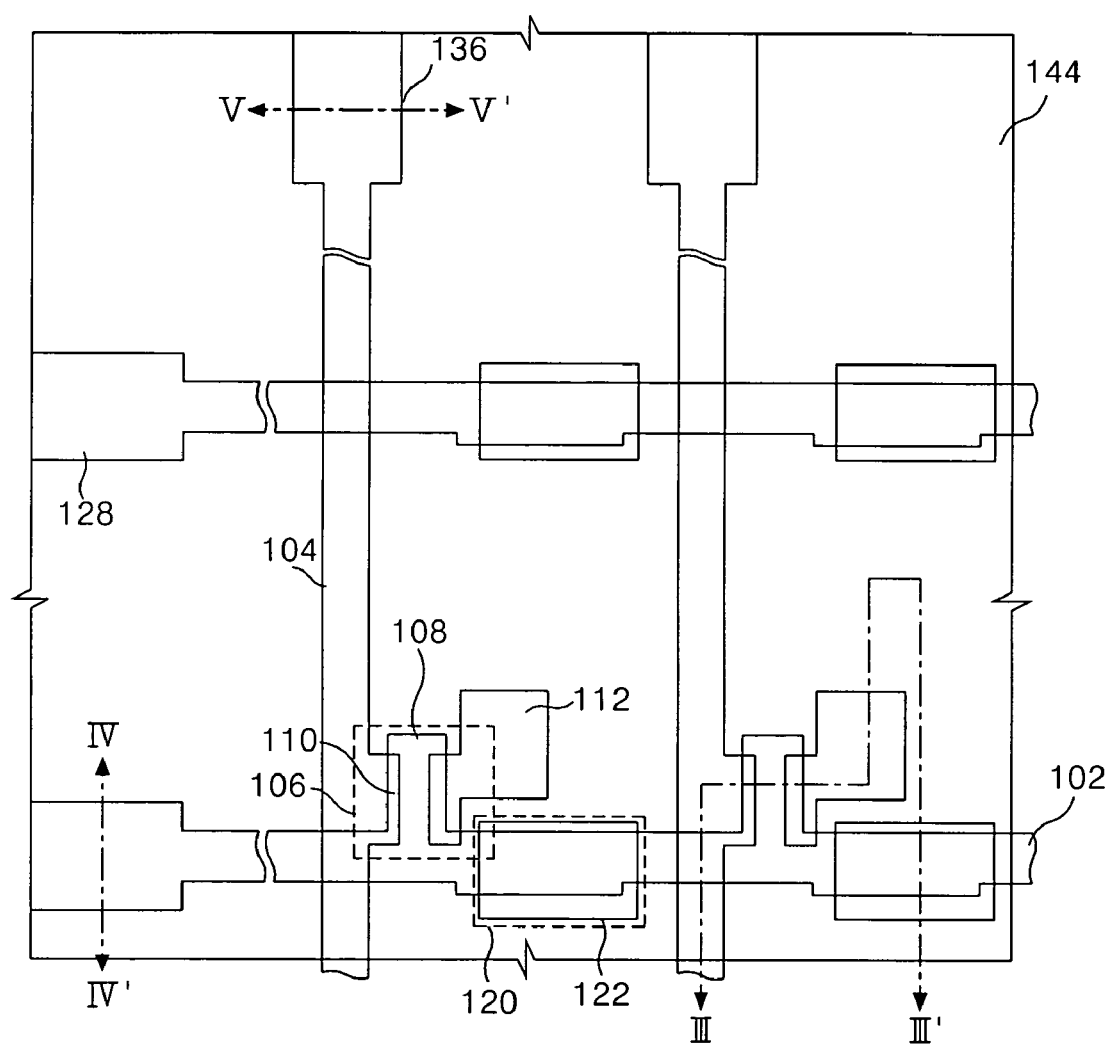
FIGS. 7A and 7B illustrate plan and sectional views, respectively, generally describing a second mask process in the method of fabricating the TFT array substrate in the LCD panel shown in FIGS. 4 and 5.
Figure 7B:
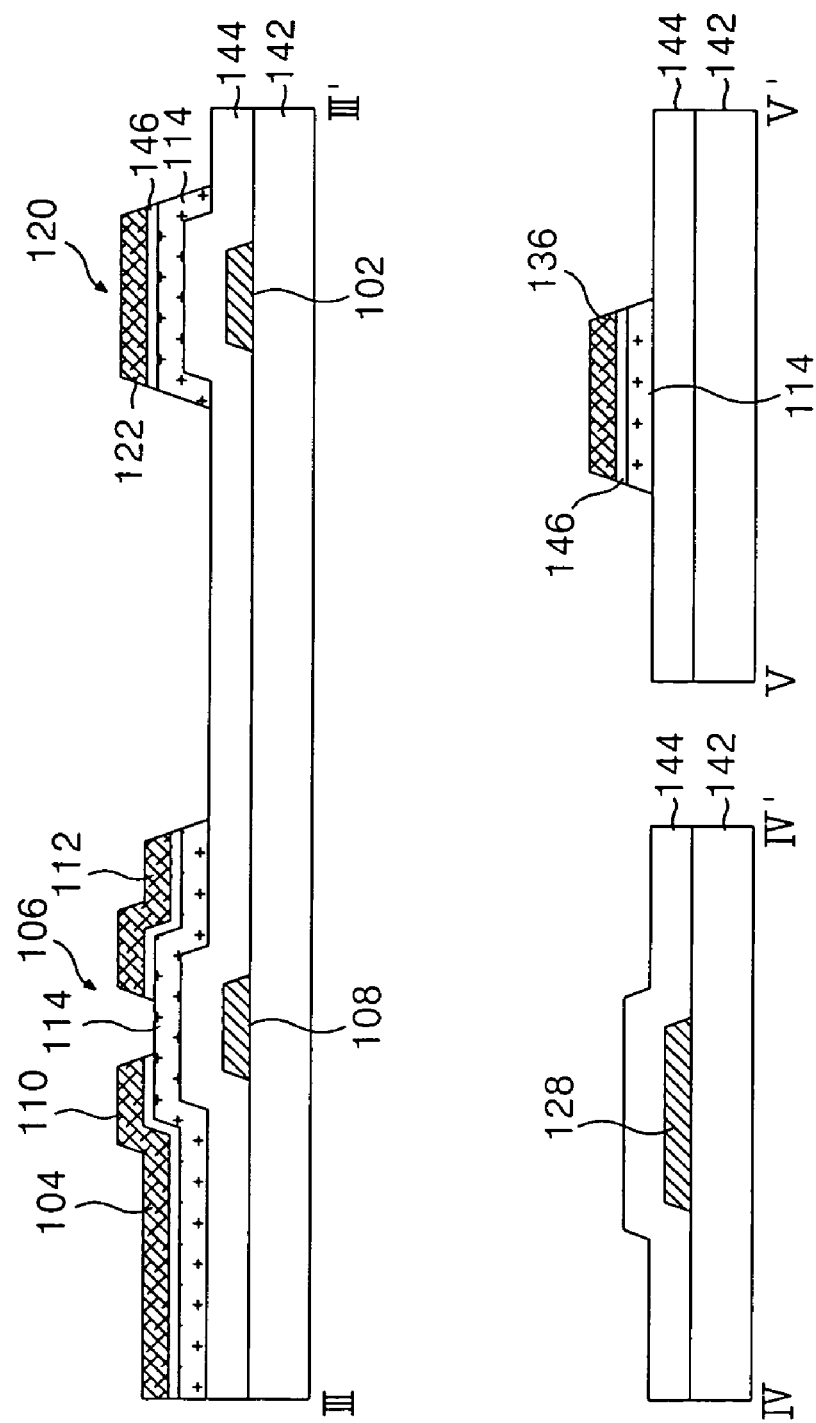

FIGS. 7A and 7B illustrate plan and sectional views, respectively, generally describing a second mask process in the method of fabricating the TFT array substrate in the LCD panel shown in FIGS. 4 and 5.

Referring to FIGS. 7A and 7B, a gate insulating film 144, a semiconductor pattern comprised of the active layer 114 and the ohmic contact layer 146, and a data metal pattern comprised of the data line 104, the source electrode 110, the drain electrode 112, the lower data pad electrode 136, and the upper storage electrode 122, may be formed on the lower substrate 142 and on the gate metal pattern in a second mask process.

FIGS. 8A to 8D illustrate sectional views specifically describing the second mask process in the method of fabricating the TFT array substrate in the LCD panel shown in FIGS. 4 and 5.

Figure 8A:
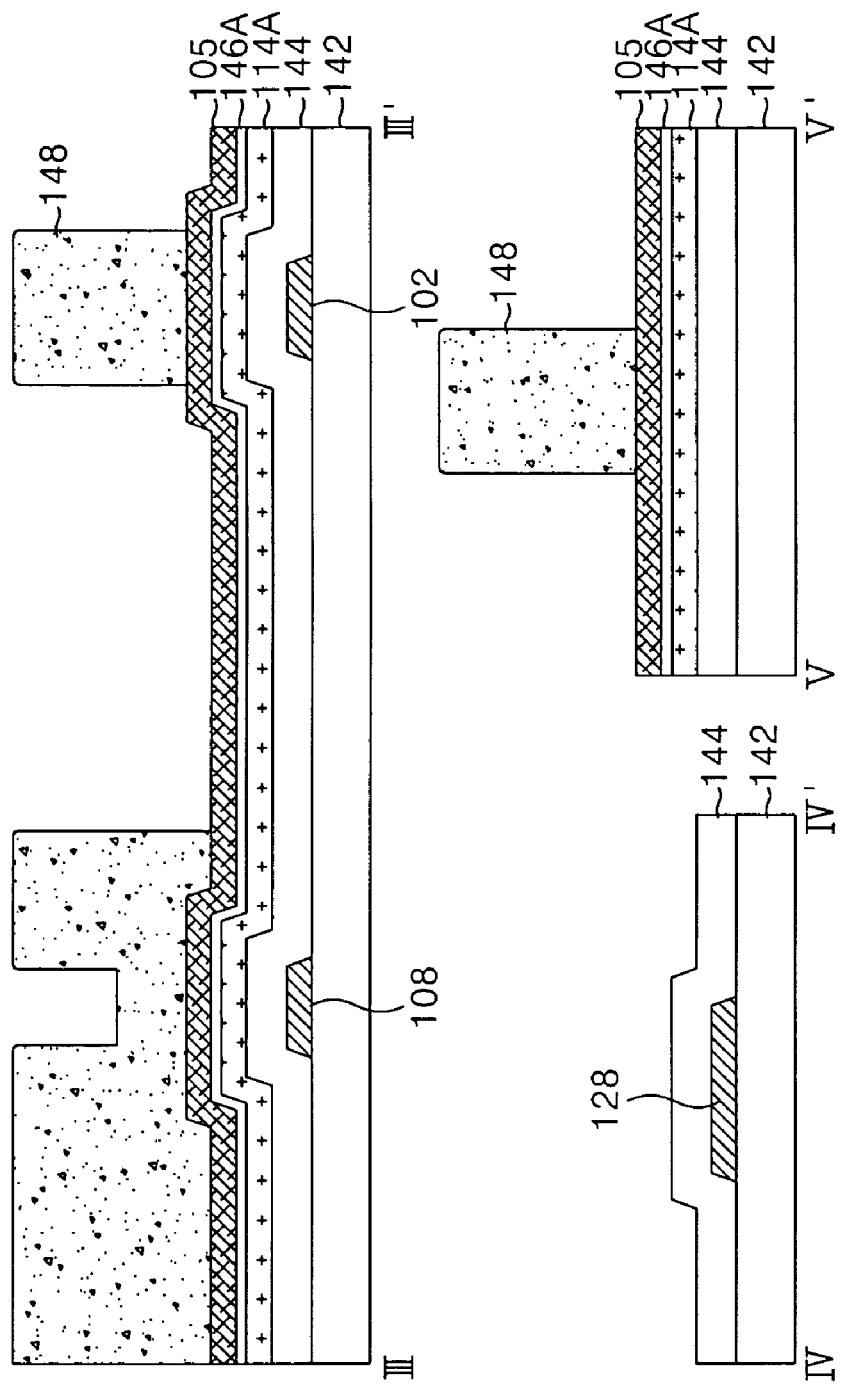

Referring to FIG. 8A, a gate insulating film 144 may be formed over the lower substrate 142 and on the gate metal pattern. In one aspect of the present invention, the gate insulating film 144 may be formed according to a deposition technique such as PEVCD, sputtering, or the like. In another aspect of the present invention, the gate insulating film 144 may, for example, include an inorganic insulating material such as silicon nitride (SiNx) or silicon oxide (SiOx).

Next, a first semiconductor layer 114A, a second semiconductor layer 146A, and a data metal layer 105 may be sequentially formed on the gate insulating film 144. In one aspect of the present invention, the first and second semiconductor layers 114A and 146A may be formed according to a deposition technique such as PEVCD, sputtering, or the like. In another aspect of the present invention, the first semiconductor layer 114A may, for example, include undoped amorphous silicon. In still another aspect of the present invention, the second semiconductor layer 146A may, for example, include n+ amorphous silicon. In yet another aspect of the present invention, the data metal layer 105 may, for example, include a metal such as Mo, Cu, Al, Cr, or the like, or combinations thereof.

A first photo-resist film may then be formed over the entire surface of the data metal layer 105 and subsequently be photolithographically patterned using a second mask pattern. According to principles of the present invention, the second mask pattern may, for example, be provided as a partial-exposure mask. For example, the second mask pattern may include a mask substrate formed of a suitably transparent material, a plurality of shielding areas and a partial-exposure area (e.g., a diffractive area or transflective area). It should be noted that areas of the mask that do not support a shielding or partial-exposure areas are exposure areas.

Subsequently, the first photo-resist film may, via the second mask pattern, be selectively exposed to light through the exposure and partial-exposure areas and be developed, thereby creating a first photo-resist pattern 148 having a step difference aligned between the shielding and partial-exposure areas arranged, for example, within a channel region of a subsequently formed TFT that includes the gate electrode 108. Accordingly, the height of the photo-resist pattern within the channel region may be lower than the height of the photo-resist pattern outside the channel region.

Figure 8B:
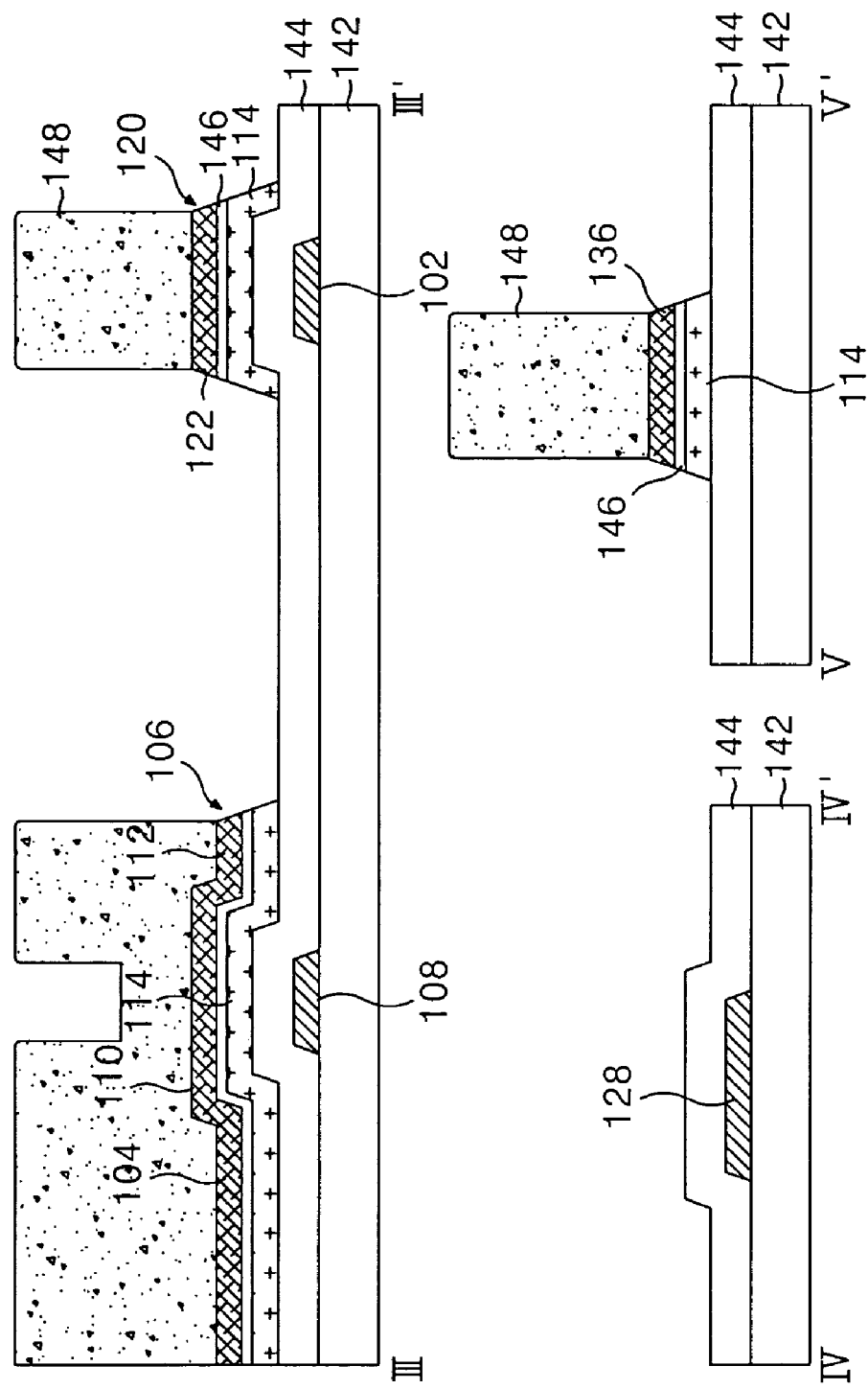

Referring next to FIG. 8B, the first photo-resist pattern 148 may be used as a mask to pattern the data metal layer 105 in a wet etching technique, thereby forming the aforementioned data metal pattern (i.e., the data line 104, the source electrode 110, the drain electrode 112, the upper storage electrode 122, and the lower data pad electrode 136), wherein the source and drain electrodes 108 and 110 are connected to each other in the channel region, and wherein the upper storage electrode 122 overlaps the gate line 102.

Next, the first photo-resist pattern 148 may be used as a mask to pattern the first and second semiconductor layers 114A and 146A in a dry etching process to form the active and ohmic contact layers 114 and 146, respectively. In one aspect of the present invention, the patterning may, for example, include removing portions of the active and ohmic contact layers 114A and 146A that are not overlapped by the data metal pattern.

After the active and ohmic contact layers 114 and 146 are formed, the portion of the first photo-resist pattern 148 having the relatively lower height (i.e., the portion of the first photo-resist pattern 148 arranged within the channel region) may be removed in an ashing process using oxygen (O2) plasma. Upon performing the ashing process, the relatively thicker portions of the first photo-resist pattern 148 (i.e., portions of the first photo-resist pattern 148 arranged outside the channel region) are thinned but, nevertheless, remain.

Figure 8D:
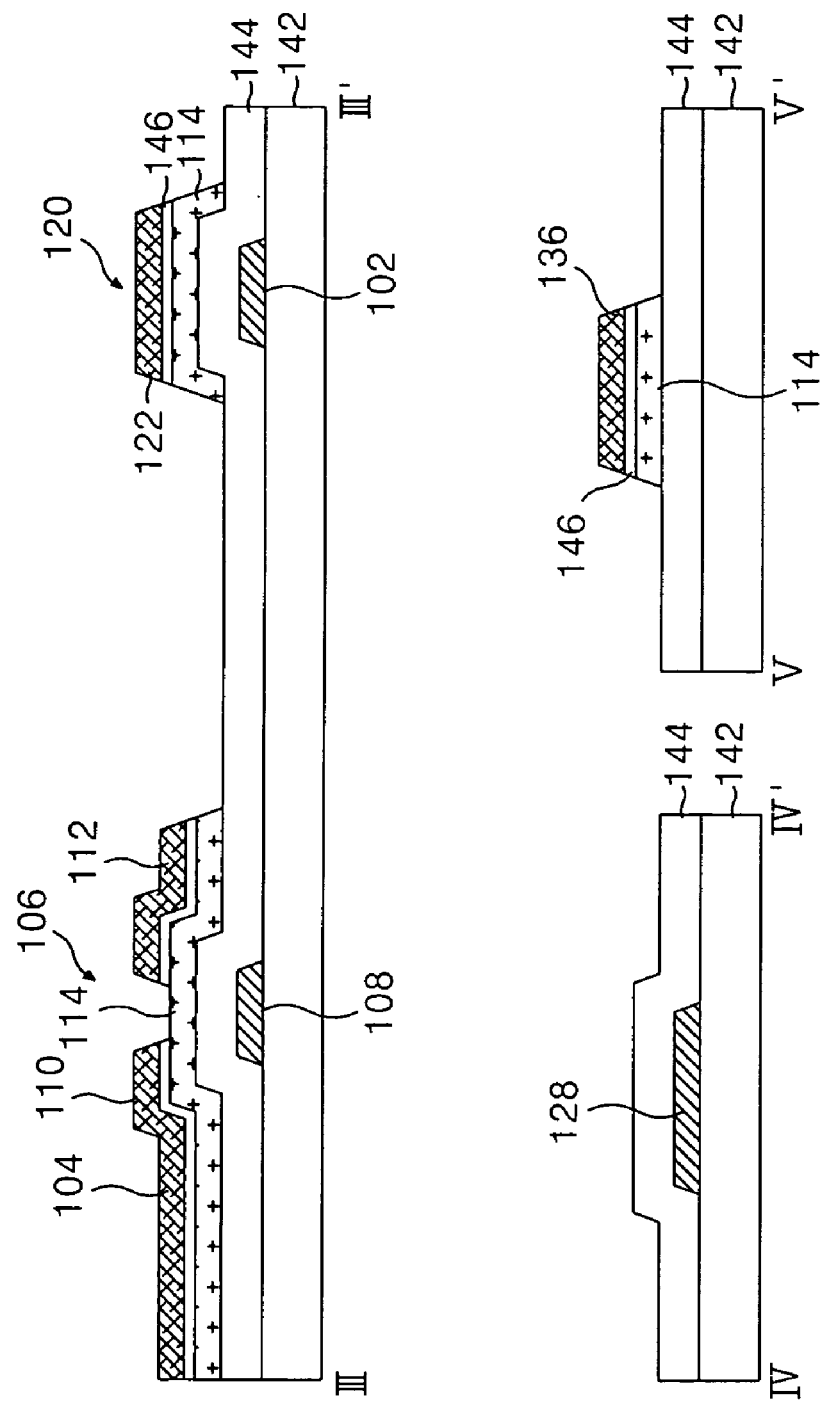

Referring to FIG. 8C, portions of the data metal pattern and the ohmic contact layer 146 in the channel region may be removed in an etching process using the thinned first photo-resist pattern 148 as a mask. As a result, the active layer 114 may be exposed within the channel region and the source electrode 110 may be disconnected from the drain electrode 112. With reference to FIG. 8D, the remaining first photo-resist pattern 148 may then be removed in a stripping process.

Figure 9A:
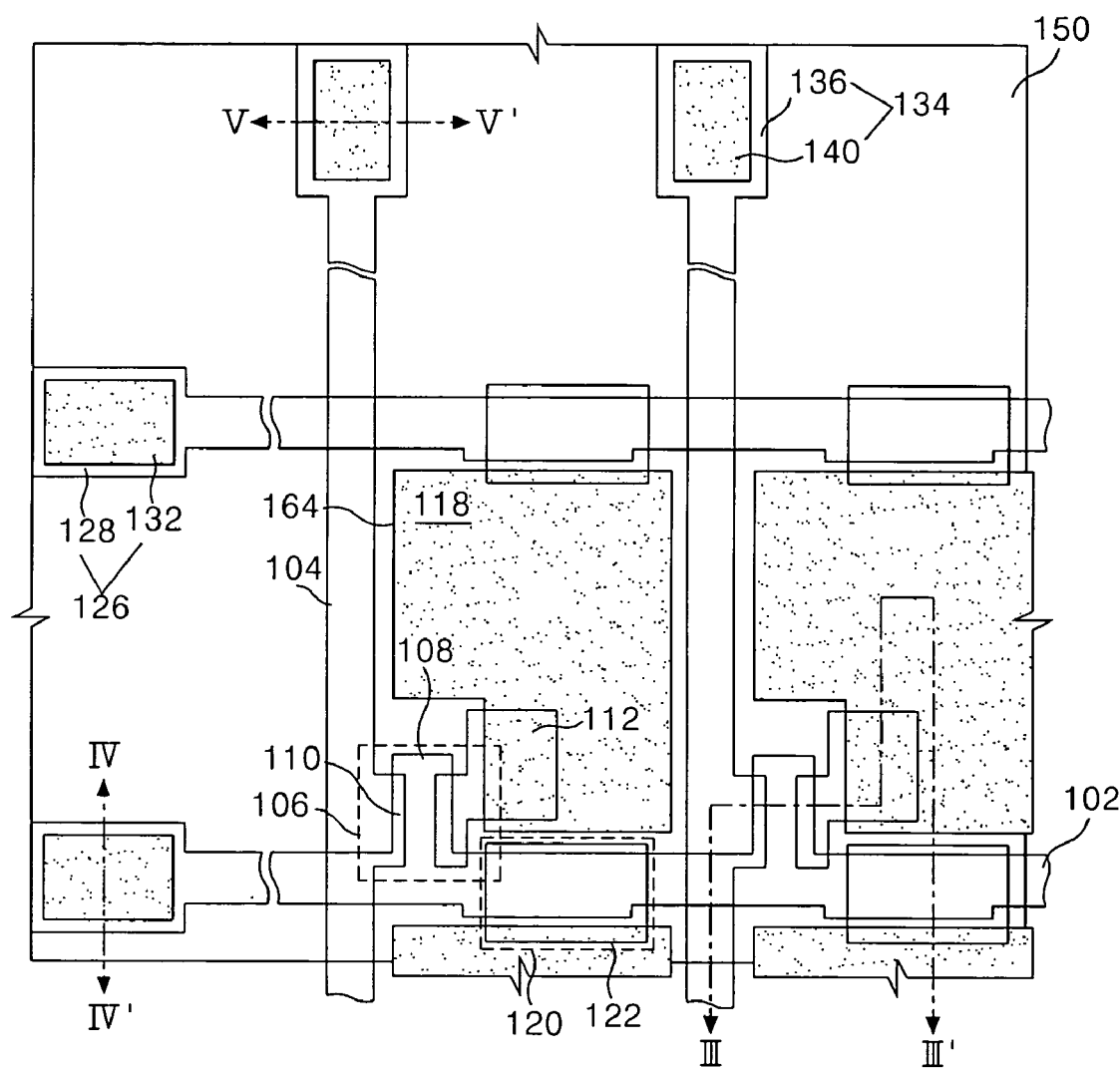
FIGS. 9A and 9B illustrate plan and sectional views, respectively, generally describing a third mask process in the method of fabricating the TFT array substrate in the LCD panel shown in FIGS. 4 and 5.
Figure 9B:
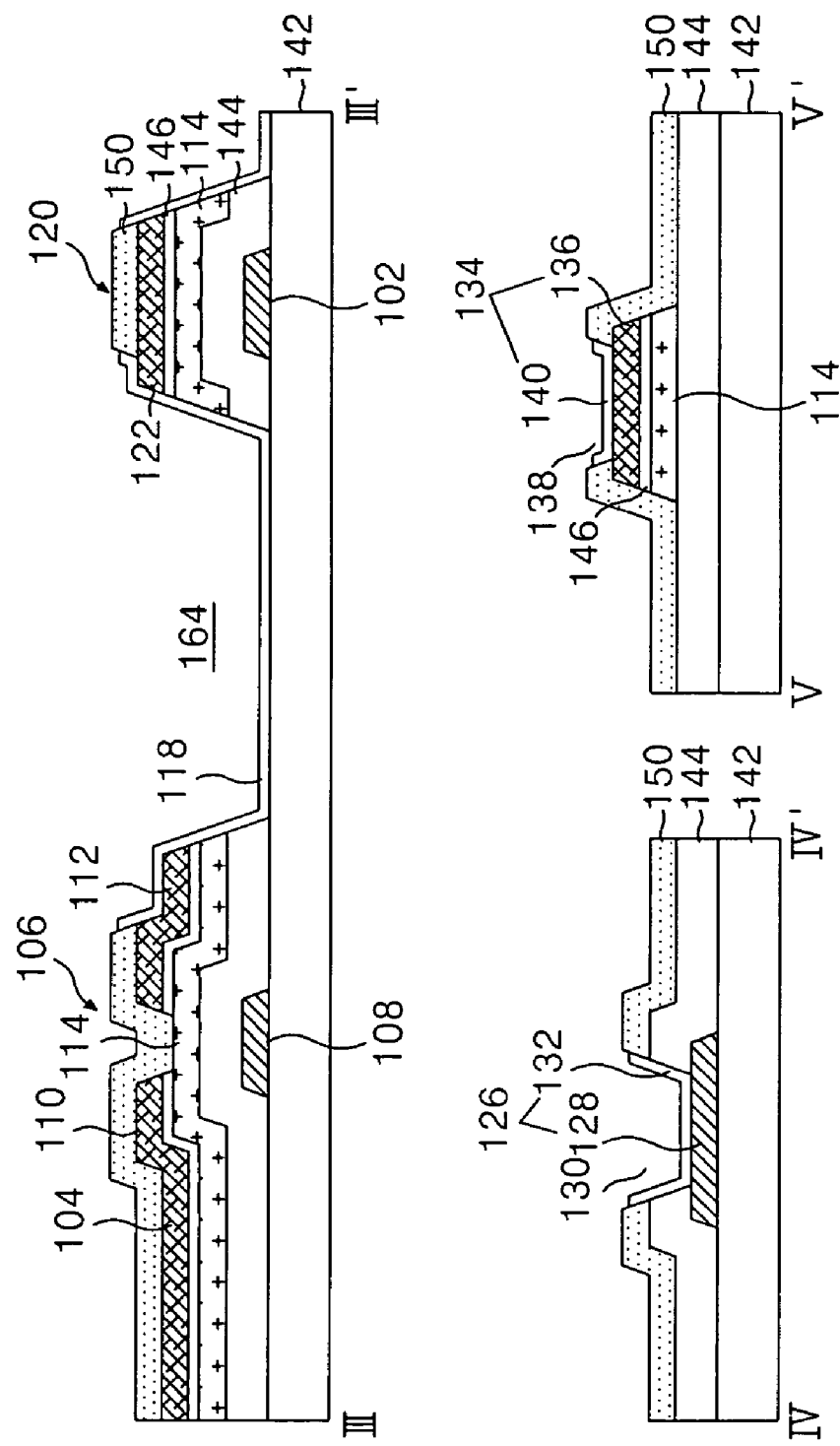

FIGS. 9A and 9B illustrate plan and sectional views, respectively, generally describing a third mask process in the method of fabricating the TFT array substrate in the LCD panel shown in FIGS. 4 and 5.

Referring to FIGS. 9A and 9B, the protective film 150 and the gate insulating film 144 are patterened, and the aforementioned transparent conductive pattern (i.e., the pixel electrode 118, the upper gate pad electrode 132, and the upper data pad electrode 140) may be formed in a third mask process. According to principles of the present invention, the transparent conductive pattern directly contacts the protective film 150, but does not overlap an upper surface thereof.

FIGS. 10A to 10D illustrate sectional views specifically describing the third mask process in the method of fabricating the TFT array substrate in the LCD panel shown in FIGS. 4 and 5.

Figure 10A:
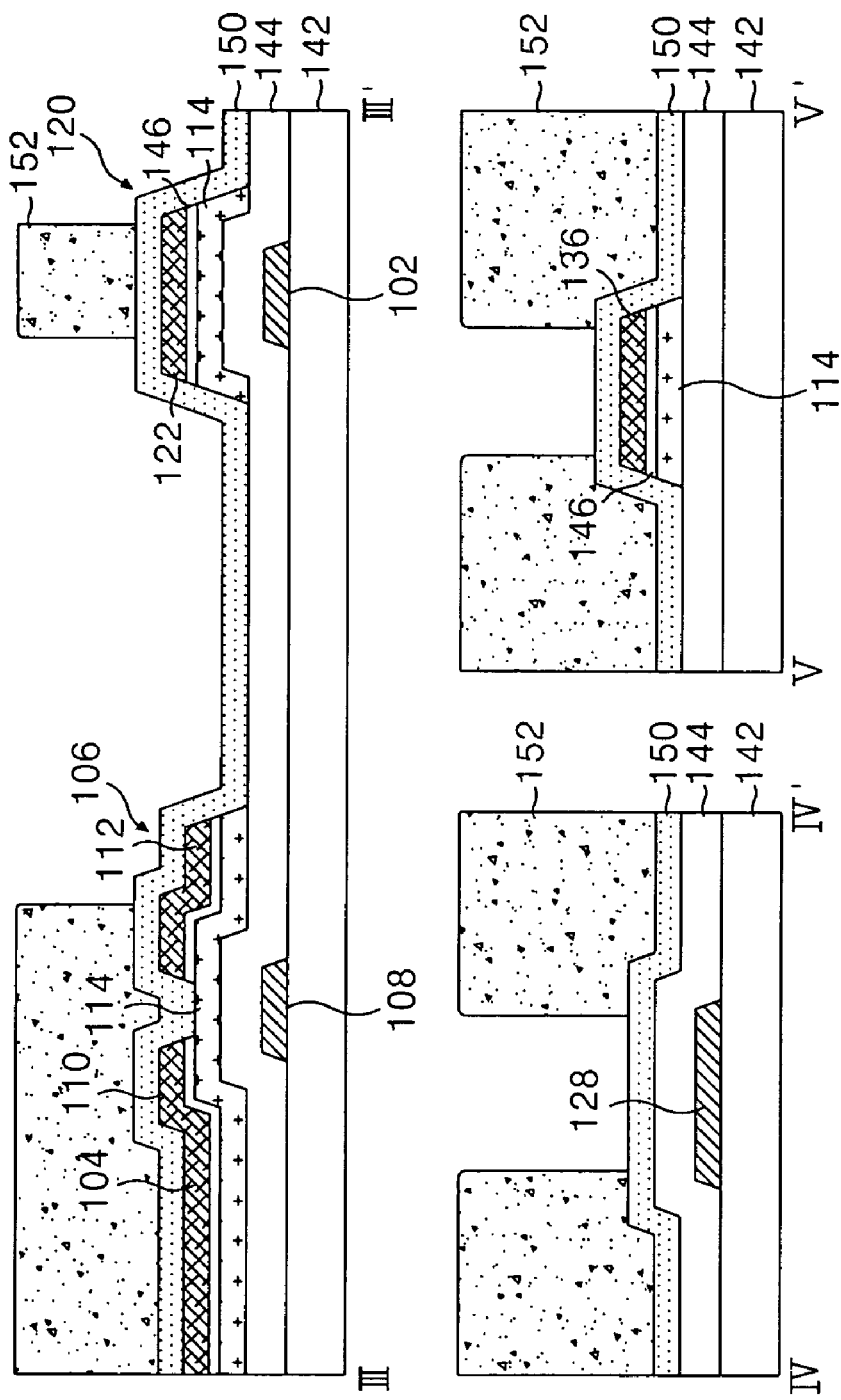

Referring to FIG. 10A, a protective film 150 may be formed over the entire surface of the gate insulating film 144 and on the data metal pattern. In one aspect of the present invention, the protective film 150 may for example, include an inorganic insulating material such as silicon nitride (SiNx), silicon oxide (SiOx), or the like, or combinations thereof, an organic insulating material such as acrylic organic compound having a small dielectric constant, BCB (benzocyclobutene), or PFCB (perfluorocyclobutane), or the like, or combinations thereof.

A second photo-resist film may then be formed over the entire surface of the protective film 150 and may be photolithographically patterned using a third mask pattern. For example, the third mask pattern may include a mask substrate formed of a suitably transparent material and a plurality of shielding areas spaced apart by a plurality of exposure areas. Subsequently, the second photo-resist film may, via the third mask pattern, be selectively exposed to light through the exposure areas and be developed, thereby creating a second photo-resist pattern 152. According to principles of the present invention, the second photo-resist pattern 152 exposes a portion of the protective film 150.

Figure 10B:
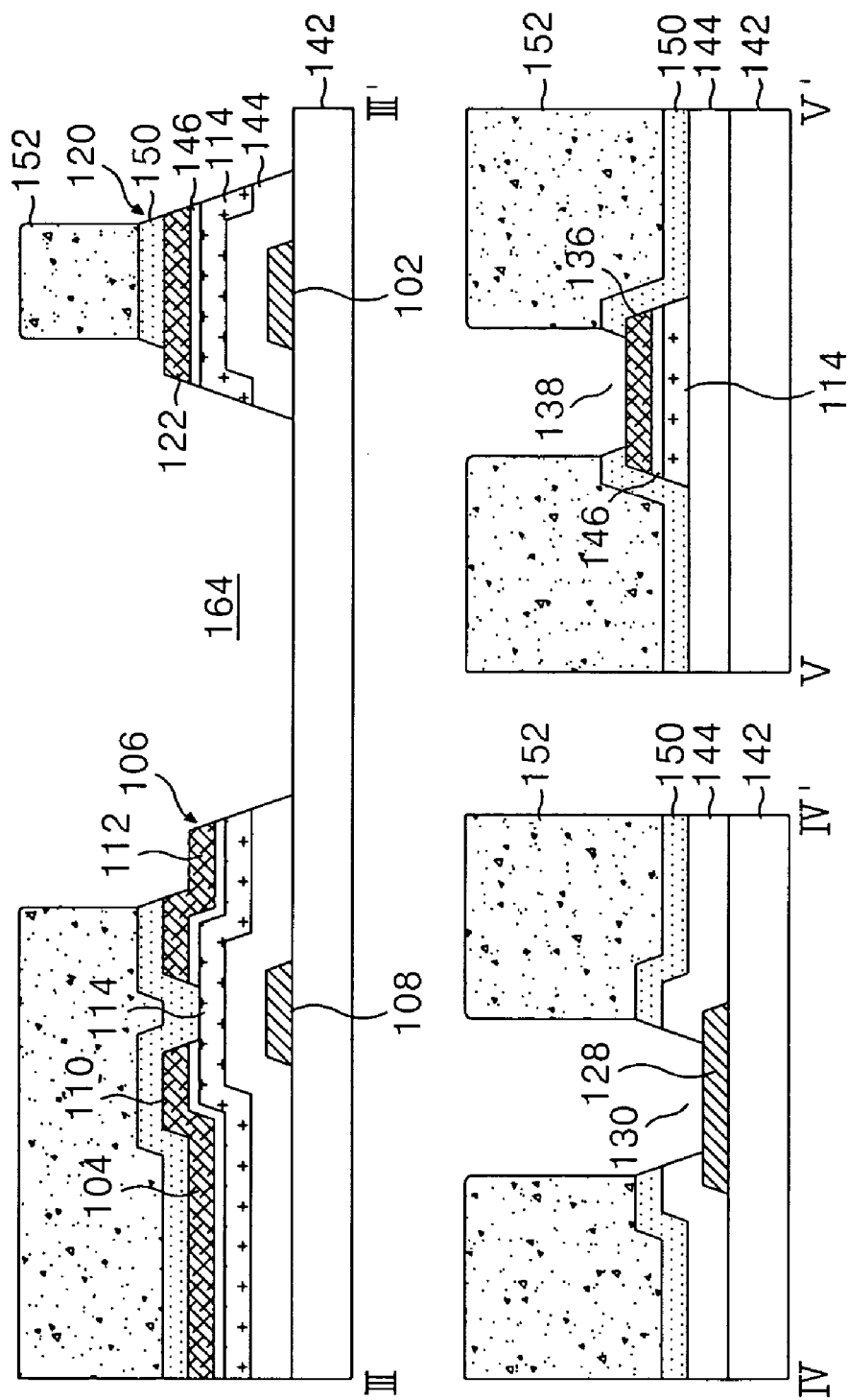

Referring to FIG. 10B, portions of the protective film 150 and the gate insulating film 144 exposed by the second photo-resist pattern 152 may be removed (i.e., patterned) in a dry etching process using the second photo-resist pattern 152 as a mask.

Thus, as a result of the dry etching, the pixel opening 164, and the first and second contact holes 130 and 138, respectively, may be formed through the protective film 150 and gate insulating film 144. For example, the pixel opening 164 may be formed through the protective film 150 and gate insulating film 144 and be aligned within the pixel area where the pixel electrode 118 is to be eventually formed. In one aspect of the present invention, the pixel opening 160 may expose the lower substrate 142, the drain electrode 112, and the upper storage electrode 122. The first contact hole 130 may be formed through the protective film 150 and gate insulating film 144 and may expose the lower gate pad electrode 128. The second contact hole 138 may be formed through the protective film 150 and may expose the lower data pad electrode 136.

Figure 10C:
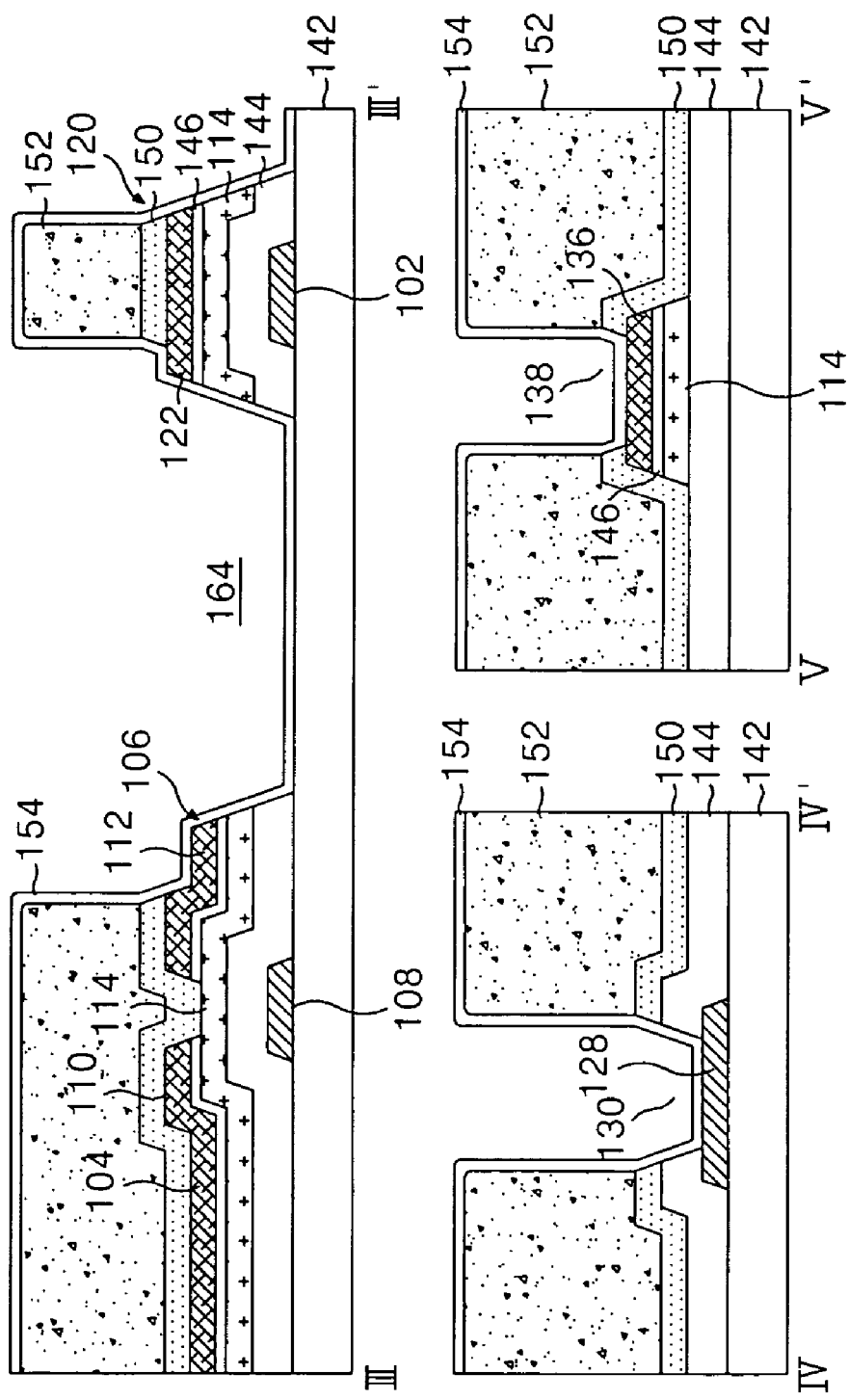

Referring to FIG. 10C, a transparent conductive material 154 may be formed over the TFT array substrate and over the second photo-resist pattern 152. In one aspect of the present invention, the transparent conductive material 154 may be formed according to a deposition technique such as sputtering, or the like. In another aspect of the present invention, the transparent conductive material 154 may, for example, include indium-tin-oxide (ITO), tin-oxide (TO), indium-zinc-oxide (IZO), SnO2, or the like, or combinations thereof.

Referring to FIG. 10D, the second photo-resist pattern 152 and portions of the transparent conductive material 154 formed thereon may be simultaneously removed in a lift-off process, thereby forming a transparent conductive pattern including the pixel electrode 118, the upper gate pad electrode 132, and the upper data pad electrode 140. Accordingly, the transparent conductive pattern directly contacts the protective film 150 within their respective holes but does not overlap any upper surface portion thereof.

Figure 11A:
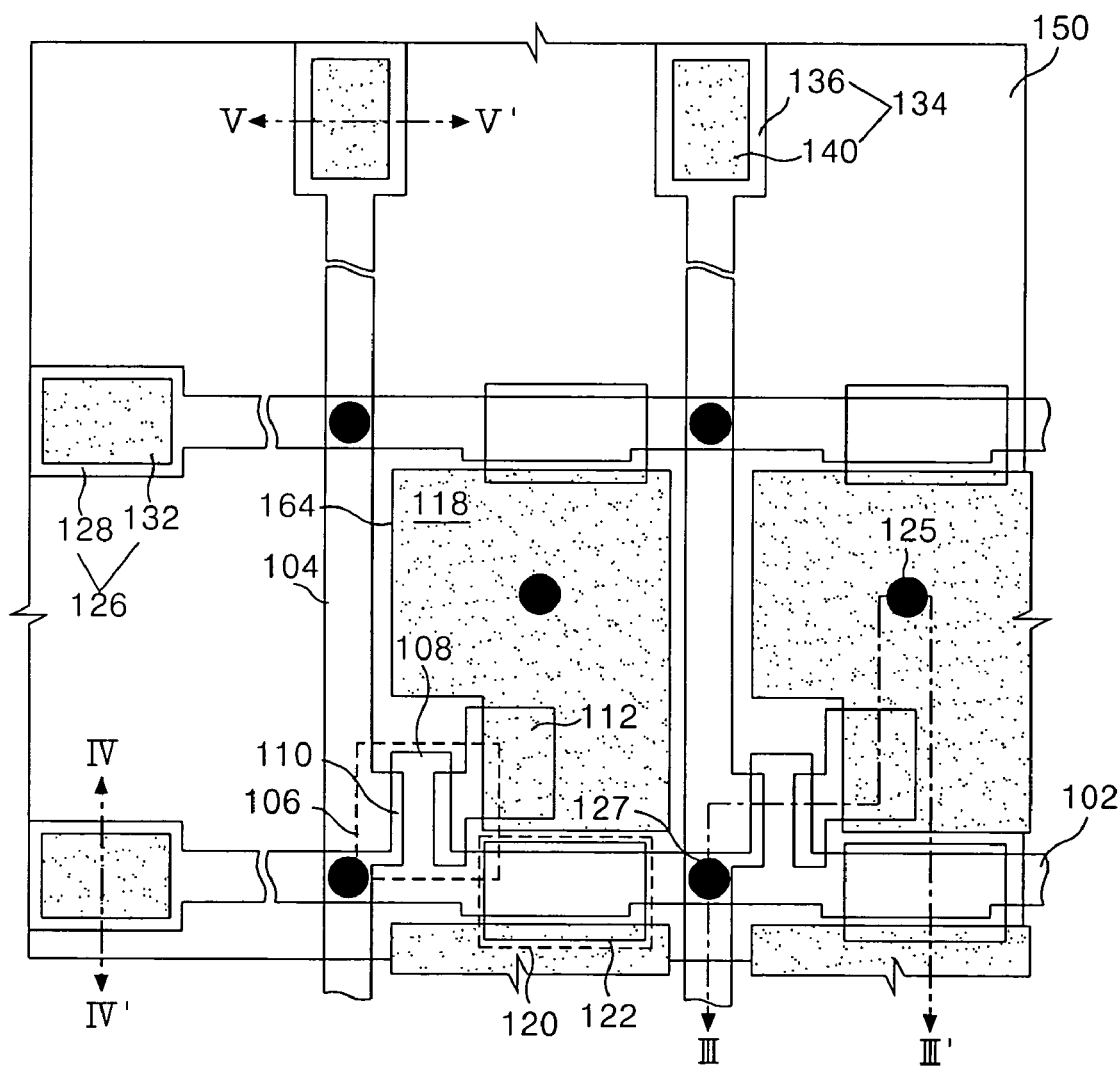
FIGS. 11A and 11B illustrate plan and section views, respectively, generally describing a fourth mask process in the method of fabricating the TFT array substrate in the LCD panel shown in FIGS. 4 and 5.
Figure 11B:
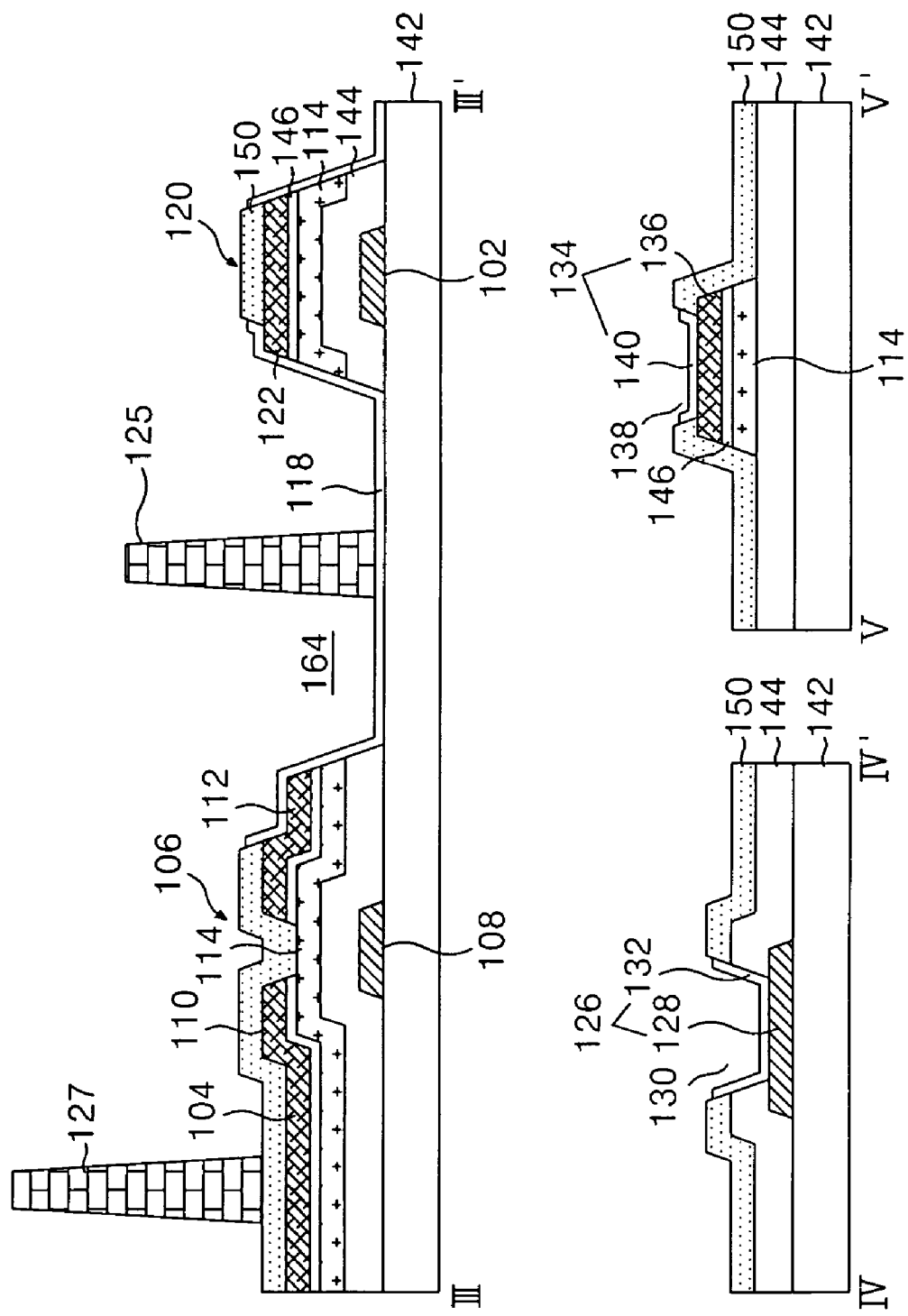

FIGS. 11A and 11B illustrate plan and section views, respectively, generally describing a fourth mask process in the method of fabricating the TFT array substrate in the LCD panel shown in FIGS. 4 and 5.

Referring to FIGS. 11A and 11B, the pattern spacer 127 and the rib 125 may be formed on the TFT array substrate 100 in a fourth mask process.

For example, an insulating layer may be formed over the TFT array substrate 100, on the protective film 150 and the pixel electrode 118 according to any suitable deposition or coating technique. According to principles of the present invention, the insulating layer may include any suitable inorganic or organic insulating material.

Next, the insulating layer may be patterned using photolithographic and etching techniques using a fourth mask to simultaneously provide the pattern spacer 127 and the rib 125. In one aspect of the present invention, the fourth mask process may be used to form the pattern spacer 127 on the protective film 150 and aligned within the wiring area (i.e., the gate line 102, the data line 104, and/or the TFT 106). In another aspect of the present invention, the fourth mask process may also be used to form the rib 125 on the pixel electrode 118. Due to the difference in thickness of structures formed at the wiring area with respect to structures formed within the pixel area, the pattern spacer 127 contacts the color filter array substrate 200 while the rib 125 does not.

FIG. 12 illustrates a plan view of a portion of an LCD panel according to a second embodiment of the present invention.

The LCD panel shown in FIG. 12 and its method of fabrication is, in many respects, similar to the LCD panel shown in FIG. 5 but differs with respect to the pattern spacer 127 and the rib 125. Thus, for the sake of brevity, only that which is different from the LCD panel of the first embodiment will be discussed in greater detail below.

Referring to FIG. 12, the pattern spacer 127 and the rib 125 are formed on the color filter array substrate 200. In one aspect of the present invention, the color filter array substrate may comprise an upper substrate 210 supporting a common electrode 220. Accordingly the pattern spacer 127 and the rib 125 may be formed on the common electrode 220. In one aspect of the present invention, the pattern spacer 127 may be aligned within the wiring area of the TFT array substrate (i.e., the gate line 102, the data line 104, and/or the TFT 106). In another aspect of the present invention, the rib 125 may be aligned with the pixel electrode 118. Due to the difference in thickness of structures formed at the wiring area of the TFT array substrate 100 with respect to structures formed within the pixel area of the TFT array substrate 100, the pattern spacer 127 contacts the TFT array substrate 100 while the rib 125 does not. Accordingly, the presence of the ribs 125 may create multiple domains of liquid crystal orientation within a single pixel area, thereby enlarging the viewing angle of the LCD panel.

It will be appreciated that the TFT array substrate 100 within the LCD panel of the second embodiment may be fabricated according to a three-mask process exemplarily outlined in FIGS. 6A to 10D, instead of the four-mask process exemplarily outlined in FIGS. 6A to 11B and discussed above with respect to the LCD panel of the first embodiment. Accordingly, the TFT array substrate 100 according to the second embodiment may be fabricated more simply and inexpensively than the TFT array substrate 100 according to the first embodiment.

As described above, the principles of the present invention incorporate a lift-off process to simplify a process of fabricating a TFT array substrate, thereby reducing the manufacturing cost and improving the production yield of the TFT array substrate. Further, the difference in thicknesses of structures arranged within the wiring and pixel areas may be leveraged to form pattern spacers 127 and ribs 125 in the same mask process to further simplify the fabrication process, reduce manufacturing cost, and improve production yield.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display panel, comprising:
    on a substrate, forming a gate line connected to a gate electrode;
    forming a gate insulating film over the substrate and on the gate line and the gate electrode;
    forming a semiconductor pattern on the gate insulating film;
    on the semiconductor pattern, forming a data line crossing the gate line, a source electrode connected to the data line, and a drain electrode opposing the source electrode, wherein a pixel area is defined by the crossing of the gate and data lines, and wherein a thin film transistor includes the gate electrode, the semiconductor pattern, the source electrode, and the drain electrode;
    forming a protective film over the entire surface of the substrate;
    providing a pixel opening through the protective film and the gate insulating film within the pixel area;
    forming a pixel electrode within the pixel opening, wherein the pixel electrode is connected to the drain electrode;
    forming a pattern spacer overlapping at least one of the gate line, the data line, and the thin film transistor; and
    forming a rib overlapping the pixel electrode, wherein the pattern spacer and the rib have the same thickness.

2. A method of fabricating a liquid crystal display panel, comprising:
    forming a gate metal layer on a substrate;
    patterning the gate metal layer using a first mask to form a gate line and a gate electrode;
    forming a gate insulating film, an undoped amorphous silicon layer, a doped amorphous silicon layer, and a data metal layer on the patterned gate metal layer;
    patterning the data metal layer, the doped amorphous silicon layer, and the undoped amorphous silicon layer using a second mask to form a data line, a source electrode, a drain electrode, and a semiconductor pattern, wherein a thin film transistor includes the gate electrode, the semiconductor pattern, the source electrode, and the drain electrode;
    forming a protective film over the entire surface of the substrate;
    forming a pixel opening passing through the protective film and the gate insulating film and forming a pixel electrode within the pixel opening using a third mask, wherein the pixel electrode is connected to the drain electrode;
    forming an insulating layer over the entire surface of the substrate; and
    patterning the insulating layer using a fourth mask to form a pattern spacer and a rib, wherein the pattern spacer overlaps at least one of the gate line, the data line, and the thin film transistor, and wherein the rib overlaps the pixel electrode.

3. A method of fabricating a liquid crystal display panel, comprising:
    forming a thin film transistor array substrate, wherein formation of the thin film transistor array substrate includes:
        forming a gate line on a first substrate;
        forming a data line crossing the gate line to define a pixel area;
        forming a gate insulating film between the gate and data lines;
        forming a thin film transistor at the crossing of the gate and data lines;
        forming a protective film over the thin film transistor;
        forming a pixel opening within the protective film and the gate insulating film;
        forming a pixel electrode within the pixel opening, wherein the pixel electrode contacts the thin film transistor; and
        forming an alignment film over the pixel electrode;
    providing a color filter array substrate;
    forming a pattern spacer on the color filter array substrate, wherein the pattern spacer overlaps at least one of the gate line, the data line, and the thin film transistor;
    forming a rib on the color filter array substrate, wherein the rib overlaps the pixel electrode, and wherein the rib is formed from the same layer as the pattern spacer;
    joining the thin film transistor array substrate with the color filter array substrate; and
    injecting a liquid crystal between the joined thin film transistor and color filter array substrates.

4. The method as claimed in claim 1, wherein forming the pixel opening and the pixel electrode includes:
    forming a photo-resist pattern on the protective film;
    etching the protective film and the gate insulating film exposed through the photo-resist pattern to form the pixel opening;

forming a transparent conductive layer over the photo-resist pattern and within the pixel opening; and removing the photo-resist pattern and the transparent conductive layer thereon to form the pixel electrode.

5. The method as claimed in claim 2, wherein said step of the pixel opening and the pixel electrode includes:

forming a photo-resist pattern on the protective film;

etching the protective film and the gate insulating film exposed through the photo-resist pattern to form the pixel opening;

forming a transparent conductive layer over the photo-resist pattern and within the pixel opening; and removing the photo-resist pattern and the transparent conductive layer thereon to form the pixel electrode.

6. The method as claimed claim 3, wherein said step of the pixel opening and the pixel electrode includes:

forming a photo-resist pattern on the protective film;

etching the protective film and the gate insulating film exposed through the photo-resist pattern to form the pixel opening;

forming a transparent conductive layer over the photo-resist pattern and within the pixel opening; and removing the photo-resist pattern and the transparent conductive layer thereon to form the pixel electrode.

7. The method as claimed in claim 1, further including:

forming a lower gate pad electrode connected to the gate line;

forming a first contact hole through the protective film and the gate insulating film to expose the lower gate pad electrode; and forming an upper gate pad electrode within the first contact hole, wherein the upper gate pad electrode is the same layer as the pixel electrode.

8. The method as claimed in claim 2, further including:

forming a lower gate pad electrode connected to the gate line;

forming a first contact hole through the protective film and the gate insulating film to expose the lower gate pad electrode; and forming an upper gate pad electrode within the first contact hole, wherein the upper gate pad electrode is the same layer as the pixel electrode.

9. The method as claimed in claim 3, further including:

forming a lower gate pad electrode connected to the gate line;

forming a first contact hole through the protective film and the gate insulating film to expose the lower gate pad electrode; and forming an upper gate pad electrode within the first contact hole, wherein the upper gate pad electrode is the same layer as the pixel electrode.

10. The method as claimed in claim 1, further including:

forming a lower data pad electrode connected to the data line;

forming a second contact hole through the protective film to expose the lower data pad electrode; and forming an upper data pad electrode within the second contact hole, wherein the upper data pad electrode is the same layer as the pixel electrode.

11. The method as claimed in claim 2, further including:

forming a lower data pad electrode connected to the data line;

forming a second contact hole through the protective film to expose the lower data pad electrode; and forming an upper data pad electrode within the second contact hole, wherein the upper data pad electrode is the same layer as the pixel electrode.

12. The method as claimed in claim 3, further including:

forming a lower data pad electrode connected to the data line;

forming a second contact hole through the protective film to expose the lower data pad electrode; and forming an upper data pad electrode within the second contact hole, wherein the upper data pad electrode is the same layer as the pixel electrode.

13. The method as claimed in claim 1, further including forming an upper storage electrode overlapping with the gate line, wherein the gate insulating film is between the gate line and the upper storage electrode, and wherein the upper storage electrode is connected to the pixel electrode.

14. The method as claimed in claim 2, further including forming an upper storage electrode overlapping with the gate line, wherein the gate insulating film is between the gate line and the upper storage electrode, and wherein the upper storage electrode is connected to the pixel electrode.

15. The method as claimed in claim 3, further including forming an upper storage electrode overlapping with the gate line, wherein the gate insulating film is between the gate line and the upper storage electrode, and wherein the upper storage electrode is connected to the pixel electrode.

16. The method as claimed in claim 1, wherein:

the pattern spacer contacts the color filter array substrate; and the rib is spaced apart from the color filter array substrate by a predetermined distance.

17. The method as claimed in claim 2, wherein:

the pattern spacer contacts the color filter array substrate; and the rib is spaced apart from the color filter array substrate by a predetermined distance.

18. The method as claimed in claim 3, wherein:

the pattern spacer contacts the thin film array transistor substrate; and the rib is spaced apart from the thin film transistor array substrate by a predetermined distance.

* * * * *